(12) United States Patent
Nakamura

(10) Patent No.: US 8,747,564 B2
(45) Date of Patent: *Jun. 10, 2014

(54) SOLUTION FOR REMOVAL OF RESIDUE AFTER SEMICONDUCTOR DRY PROCESS AND RESIDUE REMOVAL METHOD USING SAME

(75) Inventor: Shingo Nakamura, Settsu (JP)

(73) Assignee: Daikin Industries, Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/059,204

(22) PCT Filed: Aug. 4, 2009

(86) PCT No.: PCT/JP2009/063774
§ 371 (c)(1),
(2), (4) Date: Feb. 15, 2011

(87) PCT Pub. No.: WO2010/024093
PCT Pub. Date: Mar. 4, 2010

(65) Prior Publication Data
US 2011/0143547 A1    Jun. 16, 2011

(30) Foreign Application Priority Data
Aug. 25, 2008 (JP) ................................. 2008-214844

(51) Int. Cl.
*B08B 3/04* (2006.01)
*C11D 3/30* (2006.01)

(52) U.S. Cl.
USPC ....... 134/1.3; 134/2; 134/3; 134/41; 510/175; 510/176; 510/178

(58) Field of Classification Search
USPC .............. 510/175, 176, 178; 134/1.3, 2, 3, 41
See application file for complete search history.

(56) References Cited

U.S. PATENT DOCUMENTS

| | | | |
|---|---|---|---|
| 3,837,402 A * | 9/1974 | Stringer | 166/303 |
| 6,231,677 B1 | 5/2001 | Ishikawa et al. | |
| 7,250,391 B2 | 7/2007 | Kanno et al. | |
| 7,563,754 B2 | 7/2009 | Oowada et al. | |
| 2002/0169088 A1* | 11/2002 | Wang | 510/175 |
| 2003/0083214 A1 | 5/2003 | Kakizawa et al. | |
| 2003/0235996 A1* | 12/2003 | Leon et al. | 438/710 |
| 2004/0106531 A1 | 6/2004 | Kanno et al. | |
| 2005/0288199 A1 | 12/2005 | Oowada et al. | |
| 2006/0019201 A1 | 1/2006 | Muramatsu et al. | |
| 2008/0188085 A1 | 8/2008 | Muramatsu et al. | |
| 2010/0248486 A1 | 9/2010 | Nakamura | |

FOREIGN PATENT DOCUMENTS

| | | | | |
|---|---|---|---|---|
| CN | 1419709 A | | 5/2003 | |
| JP | 11-316464 A | | 11/1999 | |
| JP | 2004-094203 A | | 3/2004 | |
| JP | 2005-347587 A | | 12/2005 | |
| JP | 2006-011297 A | | 1/2006 | |
| JP | 4766114 | * | 9/2011 | ............ H01L 21/304 |
| WO | WO 2006/081406 | * | 8/2006 | ............... C11D 1/00 |
| WO | 2008/023753 A1 | | 2/2008 | |
| WO | 2008/023754 A1 | | 2/2008 | |
| WO | WO 2008/023753 | * | 2/2008 | ............ H01L 21/304 |

* cited by examiner

*Primary Examiner* — Brian P Mruk
(74) *Attorney, Agent, or Firm* — Sughrue Mion, PLLC

(57) ABSTRACT

A residue-removing solution for removing residues after a dry process, which includes an amine salt of a monocarboxylic acid and/or a salt of a polycarboxylic acid that forms a 7- or more-membered ring chelate with copper, and water, the residue-removing solution containing aqueous solution (A) or (B) as described herein. Also disclosed is a method for removing residues present on a semiconductor substrate after dry etching and/or ashing. Further, a method for manufacturing semiconductor devices is further disclosed, which includes subjecting a semiconductor substrate having Cu as an interconnect material, and a low dielectric constant film as an interlayer dielectric material, to dry etching and/or ashing; and bringing the processed semiconductor substrate into contact with the above residue-removing solution.

19 Claims, No Drawings

SOLUTION FOR REMOVAL OF RESIDUE AFTER SEMICONDUCTOR DRY PROCESS AND RESIDUE REMOVAL METHOD USING SAME

TECHNICAL FIELD

The present invention relates to a chemical solution for removing residues formed during dry etching and/or ashing in the manufacturing process of semiconductor devices, a method for removing these residues using the chemical solution, and a method for manufacturing semiconductor devices by removing these residues using the chemical solution. More particularly, the present invention relates to a residue-removing solution for use in manufacturing Cu/low-k multilayer interconnect structures.

BACKGROUND ART

Heretofore, semiconductor devices with an Al/SiO$_2$ multilayer interconnect structure, which uses Al, Al alloy or the like as an interconnect material, and uses an SiO$_2$ film as an interlayer dielectric, have been mainly manufactured. In recent years, in order to reduce the interconnect delay caused by the miniaturization of semiconductor devices, semiconductor devices with a Cu/low-k multilayer interconnect structure, which uses Cu with low resistance as an interconnect material and a low-k film (a low dielectric constant film) with low interconnect capacitance as an interlayer dielectric, are being manufactured in large quantities.

Cu/low-k multilayer interconnect structures are produced by a process called damascene. In this process, an interconnect structure is obtained by forming trenches or holes (via holes) in an interlayer dielectric substrate, and then filling the trenches or holes with an interconnect material such as Cu.

In a process called dual damascene, trenches for an interconnect and via holes are formed continuously in an interlayer dielectric substrate made of a low-k film or the like, and then filled with an interconnect material such as Cu. A dual damascene structure can be formed by a via-first process, wherein via holes are formed prior to trenches for an interconnect; or conversely, by a trench-first process, wherein trenches for an interconnect are formed prior to via holes; or by other processes such as a middle-first process or a dual hard mask process.

In, for example, processes such as the via-first process via holes are formed in an interlayer dielectric substrate by dry etching, and then filled with a filling material and planarized. Lithography is subsequently performed to form trenches, and dry etching follows. Subsequently, ashing or a like process is performed to remove unwanted substances such as resist or filling material from the substrate having trenches and via holes.

Even after this process, however, unwanted substances (hereinafter referred to as "residues after a dry process") that cannot be completely removed remain on the substrate.

Moreover, dry processes using plasma, such as dry etching and ashing, cause damage to Cu used as the interconnect material and the low-k film as the interlayer dielectric. Further, when the substrate is exposed to air while being transferred from one process to another, a Cu oxide film is formed on the surface of the Cu metal interconnect.

In a damascene structure, when trenches and via holes are filled with TaN as a barrier metal and metals such as Cu as an interconnect material, the presence of residues or Cu oxide film after a dry process leads to defective semiconductor devices. For this reason, these residues are typically removed using a polymer-removing solution. Because the damaged low-k film is structurally more fragile than the original, it is easily etched by a chemical solution or the like, and undergoes changes in pattern dimensions. Thus, during removal of these residues, it is necessary to prevent the corrosion of Cu caused by the chemical solution, and inhibit etching of the low-k film.

When commercially available known polymer-removing solutions or etchants are used to remove the residues and Cu oxide films after a dry process, problems with workability arise. For example, the residues can be removed using hydrochloric acid or fluoric acid diluted with water, but a large number of dissociated H$^+$ tend to cause Cu corrosion. Moreover, if the interlayer dielectric film (especially when it is a porous low-k interlayer dielectric film) has been damaged by dry etching, the surface condition of the interlayer dielectric may be degraded by etching, or the substrate cannot be processed to the dimensions as designed.

Further, dry processes are becoming more diverse due to the miniaturization of device structures, different types of low-k films, and the like. For example, in addition to known dry processes such as dry etching using a resist mask and ashing using oxygen plasma, dry processes such as dry etching using a hard mask and ashing using He/H$_2$ plasma are now being used. Along with such changes, there is a desire for the residues and Cu oxide films after a dry process to be selectively removed without damaging Cu or low-k films.

Low-k films, however, are often damaged by a dry process; and, when cleaned with a polymer-removing solution, they are thus easily etched and undergo changes in pattern dimensions. Further, apparatuses for cleaning semiconductor devices are changing from batch-type apparatuses to single-wafer-type apparatuses. Accordingly, with a method that uses a known removing solution, it is difficult to completely remove, in a short period of time, the residues after a dry process, which strongly adhere to the Cu/low-k structure. Although the Cu bulk is not corroded by cleaning, a close examination thereof often reveals the presence of cracking and roughness along the grain boundaries of the Cu surface. It is very likely that the device performance is adversely affected by the minor cracking and roughness of the Cu surface. Further, the growth of Cu oxide films caused by exposure of processed wafers to air after the cleaning process may also cause device defects.

When Cu/low-k multilayer interconnect structures are formed using known chemical solutions such as hydrochloric acid and fluoric acid, it is difficult to inhibit Cu corrosion and etching of low-k films, and to selectively remove the Cu oxide films and residues after a dry process.

Polymer-removing solutions intended for Cu/low-k multilayer interconnect structures have recently been developed (for example, Patent Literatures 1 to 4). With these polymer-removing solutions, however, it is difficult to inhibit Cu corrosion and completely remove the residues after a dry process in a short period of time without damaging the low-k film. Further, it poses a greater challenge to inhibit cracking and roughness of the Cu surface.

In view of the above-described current situation, the inventors of the present invention proposed a chemical solution capable of inhibiting cracking and roughness of the Cu surface without damaging Cu and low-k films, and that is also capable of removing the residues after a dry process in a short period of time (Patent Literatures 5 and 6).

Today, however, there is a demand for a polymer-removing solution for higher quality Cu/low-k multilayer interconnect structures. Specifically, it is necessary to prevent Cu corrosion and minimize cracking and roughness of the Cu surface while causing little damage to newly introduced porous low-k films. In order to prevent further roughness of the Cu surface, it is imperative to leave, rather than remove, a Cu thin film layer, which is formed on the Cu surface as a result of damage during a dry process after residues are removed by the chemical solution. Additionally, methods for leaving this thin film as a protection film until the next process are spreading. Leaving the thin film is considered to be useful for improving the yield. There is a demand for a polymer-removing solution that satisfies the above-described requirements and that can completely remove residues after a dry process in a short period of time.

CITATION LIST

Patent Literatures

PLT 1: Japanese Unexamined Patent Publication No. 11-316464
PLT 2: Japanese Unexamined Patent Publication No. 2004-94203
PLT 3: Japanese Unexamined Patent Publication No. 2005-347587
PLT 4: Japanese Unexamined Patent Publication No. 2006-11297
PLT 5: WO Publication No. 2008/023753
PLT 6: WO Publication No. 2008/023754

SUMMARY OF INVENTION

Technical Problems

In view of the above-described present situation, an object of the present invention is to provide a chemical solution capable of completely removing the residues after a dry process in a short period of time, wherein the chemical solution causes less damage to low-k films than before, and prevents cracking and roughness of the Cu surface by inhibiting Cu corrosion so as to leave, rather than remove, a Cu thin film, which is formed on the Cu surface as a result of damage during a dry process. Another object of the present invention is to provide a method for manufacturing semiconductor devices using the chemical solution.

Solution to Problems

As a result of intensive studies, the present inventors found that the above-described objects can be achieved by a residue-removing solution for removing residues after a dry process, which comprises an amine salt of a monocarboxylic acid and/or a salt of a polycarboxylic acid that forms a 7- or more-membered ring chelate with copper, and water, the residue-removing solution comprising (A) or (B) described below. The present inventors conducted further studies, and accomplished the present invention.

(A) a chemical solution comprising
(1) a Brønsted acid whose pKa is at least 3 at 25° C.,
(2) an amine salt of a monocarboxylic acid, and/or (3) at least one member selected from the group consisting of an ammonium salt, an amine salt, and a quaternary ammonium salt of a polycarboxylic acid that forms a 7- or more-membered ring chelate with copper, and
(4) water,
wherein the pH of this aqueous solution is within a predetermined range (hereinafter sometimes referred to as "residue-removing solution (A)"), or (B) a chemical solution comprising
(5) an amine salt of a monocarboxylic acid and/or (6) an amine salt of a polycarboxylic acid that forms a 7- or more-membered ring chelate with copper, and
(7) water,
wherein the pH of this aqueous solution is within a predetermined range (hereinafter sometimes referred to as "residue-removing solution (B)").

Specifically, the present invention provides the following residue-removing solution.

Item 1. A residue-removing solution for removing residues after a dry process, comprising an amine salt of a monocarboxylic acid and/or a salt of a polycarboxylic acid that forms a 7- or more-membered ring chelate with copper, and water, the residue-removing solution comprising (A) or (B) described below:

(A) an aqueous solution comprising
(1) a Brønsted acid whose pKa is at least 3 at 25° C.,
(2) an amine salt of a monocarboxylic acid, and/or (3) at least one member selected from the group consisting of an ammonium salt, an amine salt, and a quaternary ammonium salt of a polycarboxylic acid that forms a 7- or more-membered ring chelate with copper, and
(4) water,
wherein the pH of the aqueous solution is equal to or less than the pKa of the monocarboxylic acid at 25° C.; is equal to or less than the $pKa_2$ of the polycarboxylic acid at 25° C.; or is equal to or less than the pKa of the monocarboxylic acid at 25° C. or $pKa_2$ of the polycarboxylic acid at 25° C., whichever is greater, when (2) and (3) coexist;

(B) an aqueous solution comprising
(5) an amine salt of a monocarboxylic acid, and/or (6) an amine salt of a polycarboxylic acid that forms a 7- or more-membered ring chelate with copper, and
(7) water,
wherein the pH of the aqueous solution is equal to or greater than the pKa of the monocarboxylic acid at 25° C.; is equal to or greater than the $pKa_2$ of the polycarboxylic acid at 25° C.; or is equal to or greater than the pKa of the monocarboxylic acid at 25° C. or $pKa_2$ of the polycarboxylic acid at 25° C., whichever is greater, when (5) and (6) coexist.

Item 2. The residue-removing solution according to Item 1, comprising (B) above.

Item 3. The residue-removing solution according to Item 1 or 2, wherein, in (B) above, the monocarboxylic acid in (5) is acetic acid or propionic acid, and the polycarboxylic acid in (6) that forms a 7- or more-membered ring chelate with copper is succinic acid, glutaric acid, or adipic acid.

Item 4. The residue-removing solution according to Item 1, 2, or 3, wherein, in (B) above, the amine salt in (5) and the amine salt in (6) are each a salt of methylamine, ethylamine, butylamine, piperidine, morpholine, ethanolamine, diethanolamine, or triethanolamine.

Item 5. The residue-removing solution according to any one of Items 1 to 4, wherein, in (B) above, the pH is 6 to 9.5.

Item 6. The residue-removing solution according to any one of Items 1 to 5, comprising, in (B) above, 0.05 to 30 wt% of the amine salt of the monocarboxylic acid in (5) and/or the amine salt of the polycarboxylic acid in (6) that forms a 7- or more-membered ring chelate with copper.

Item 7. The residue-removing solution according to Item 1, comprising (A) above.

Item 8. The residue-removing solution according to Item 1 or 7, wherein, in (A) above, the Brønsted acid (1) whose pKa is at least 3 at 25° C. is an inorganic acid, monocarboxylic acid, or polycarboxylic acid.

Item 9. The residue-removing solution according to Item 8, wherein, in (A) above, the inorganic acid is carbonic acid or nitrous acid, the monocarboxylic acid is acetic acid or propionic acid, and the polycarboxylic acid is succinic acid, glutaric acid, or adipic acid.

Item 10. The residue-removing solution according to any one of Items 1 and 7 to 9, wherein, in (A) above, the monocarboxylic acid in (2) is acetic acid or propionic acid, and the polycarboxylic acid in (3) that forms a 7- or more-membered ring chelate with copper is succinic acid, glutaric acid or adipic acid.

Item 11. The residue-removing solution according to any one of Items 1 and 7 to 10, wherein, in (A) above, the amine salt in (2) and the amine salt in (3) are each a salt of methylamine, ethylamine, butylamine, piperidine, morpholine, ethanolamine, diethanolamine, or triethanolamine, and the quaternary ammonium salt in (3) is a tetramethylammonium salt.

Item 12. The residue-removing solution according to any one of Items 1 and 7 to 11, wherein, in (A) above, the pH is 4 to 6.

Item 13. The residue-removing solution according to any one of Items 1 and 7 to 12, comprising, in (A) above, 0.05 to 30 wt % of the Brønsted acid (1) whose pKa is at least 3 at 25° C., and 0.05 to 30 wt % of the amine salt (2) of the monocarboxylic acid and/or at least one member (3) selected from the group consisting of an ammonium salt, an amine salt, and a quaternary ammonium salt of the polycarboxylic acid that forms a 7- or more-membered ring chelate with copper.

Item 14. The residue-removing solution according to any one of Items 1 to 13, further comprising a fluorine-containing compound.

Item 15. The residue-removing solution according to any one of Items 1 to 14, further comprising a neutral organic compound.

Item 16. The residue-removing solution according to any one of Items 1 to 15, further comprising a Cu surface-protective agent being at least one member selected from the group consisting of (1) a compound comprising, as a basic skeleton, a five-membered heteroaromatic compound (excluding compounds having three consecutive N atoms) having a structure represented by Formula: =N—NH—, wherein the pH of an aqueous solution of the compound (10 ppm, 23° C.) is 7 or less, (2) a compound comprising, as a basic skeleton, a five-membered heteroaromatic compound having a structure represented by Formula: —N=C(SH)—X— (wherein X represents NH, O, or S), wherein the pH of an aqueous solution of the compound (10 ppm, 23° C.) is 7 or less, and (3) a compound comprising, as a basic skeleton, a six-membered heteroaromatic compound having at least one nitrogen atom (N), wherein the pH of an aqueous solution of the compound (10 ppm, 23° C.) is 7 or greater.

Item 17. The residue-removing solution according to any one of Items 1 to 16 further comprising a surfactant.

Item 18. A method for removing residues present on semiconductor substrates after dry etching and/or ashing, the method comprising bringing a semiconductor substrate after dry etching and/or ashing into contact with the residue-removing solution of any one of Items 1 to 17.

Item 19. The method according to Item 18, wherein the semiconductor substrate has Cu as an interconnect material, and a low dielectric constant film (a low-k film) as an interlayer dielectric material.

Item 20. A method for manufacturing semiconductor devices comprising the steps of (a) subjecting a semiconductor substrate having Cu as an interconnect material, and a low dielectric constant film (a low-k film) as an interlayer dielectric material, to dry etching and/or ashing; and (b) bringing the semiconductor substrate processed in Step (a) into contact with the residue-removing solution of any one of Items 1 to 17.

Advantageous Effects of Invention

The residue-removing solution of the present invention can remove' residues after a dry process without causing cracking and roughness of the Cu surface, by inhibiting etching of a silicon-containing film and a low-k film, and also inhibiting Cu corrosion so as to leave, rather than remove, a thin film formed on the Cu surface as a result of damage during a dry process.

DESCRIPTION OF EMBODIMENTS

The present invention is described in detail below.

I. Residue-Removing Solution After Semiconductor Dry Process

The residue-removing solution after a semiconductor dry process according to the present invention contains an amine salt of a monocarboxylic acid and/or a salt of a polycarboxylic acid that forms a 7- or more-membered ring chelate with copper, and water, and comprises a composition described in (A) or (B) below.

A) an aqueous solution comprising (1) a Brønsted acid whose pKa is at least 3 at 25° C., (2) an amine salt of a monocarboxylic acid and/or (3) at least one member selected from the group consisting of an ammonium salt, an amine salt, and a quaternary ammonium salt of a polycarboxylic acid that forms a 7- or more-membered ring chelate with copper, and (4) water, wherein the pH of the aqueous solution is equal to or less than the pKa of the monocarboxylic acid at 25° C.; is equal to or less than the $pKa_2$ of the polycarboxylic acid at 25° C.; or is equal to or less than the pKa of the monocarboxylic acid at 25° C. or $pKa_2$ of the polycarboxylic acid at 25° C., whichever is greater, when (2) and (3) coexist;

(B) an aqueous solution comprising (5) an amine salt of a monocarboxylic acid and/or (6) an amine salt of a polycarboxylic acid that forms a 7- or more-membered ring chelate with copper, and (7) water, wherein the pH of the aqueous solution is equal to or greater than the pKa of the monocarboxylic acid at 25° C.; is equal to or greater than the $pKa_2$ of the polycarboxylic acid at 25° C.; or is equal to or greater than the pKa of the monocarboxylic acid at 25° C. or $pKa_2$ of the polycarboxylic acid at 25° C., whichever is greater, when (5) and (6) coexist.

The residue-removing solution can substantially completely remove residues after a dry process, while effectively inhibiting Cu corrosion, as well as Cu surface cracking and roughness.

Residue-Removing Solution (A)

Examples of the Brønsted acid (1) whose pKa is at least 3 at 25° C. contained in the residue-removing solution (A) include inorganic acids, monocarboxylic acids, or polycarboxylic acids. As used herein, the Brønsted acid is particularly a Brønsted acid whose pKa (or $pKa_2$) at 25° C. is 3 to 7, further preferably 3 to 5, in order to remove residues while protecting the Cu surface.

Examples of inorganic acids include carbonic acid, nitrous acid, etc., with carbonic acid being preferable.

Examples of monocarboxylic acids include $C_1$-$C_8$ monocarboxylic acids. Specific examples include aliphatic $C_1$-$C_4$ monocarboxylic acids such as formic acid, acetic acid, propionic acid, butyric acid, valeric acid, etc., with acetic acid being preferable.

Examples of polycarboxylic acids include $C_4$-$C_8$ polycarboxylic acids. Specific examples include aliphatic $C_4$-$C_6$ dicarboxylic acids such as succinic acid, glutaric acid, adipic acid, etc., with succinic acid or glutaric acid being preferable, and succinic acid being more preferable.

Particularly preferable examples of the Brønsted acid (1) above are aliphatic monocarboxylic acids (particularly acetic acid) and aliphatic dicarboxylic acids (particularly succinic acid). These acids are preferable because they can remove residues without roughening the Cu surface.

The proportion (concentration) of the Brønsted acid (1) in the residue-removing solution (A) can be suitably selected according to the amount and nature of residues to be removed after a dry process. The concentration of the acid in the residue-removing solution is usually 0.05 to 30 wt %, preferably 0.1 to 10 wt %, more preferably 0.3 to 7 wt %.

The amine salt of the monocarboxylic acid (2) contained in the residue-removing solution (A) refers to a salt formed from substantially equimolar amounts of monocarboxylic acid and amine. Examples of monocarboxylic acids to form the amine salt of the monocarboxylic acid (2) include $C_1$-$C_8$ monocarboxylic acids. Specific examples include aliphatic $C_1$-$C_4$ monocarboxylic acids such as formic acid, acetic acid, propionic acid, etc., with acetic acid being preferable.

Examples of amines to form the amine salt in (2) include amines represented by Formula I:

$$R^1_w H_{3-w} N \qquad \text{I}$$

wherein w represents an integer from 1 to 3; $R^1$ is an alkyl group that may be substituted with a hydroxyl group; and when w is 2 or 3, each $R^1$ may be the same or different, or two $R^1$s may be bonded to each other to form a ring, and carbons that form the ring may be substituted with heteroatoms.

Examples of $R^1$ include $C_1$-$C_4$ alkyl groups such as methyl, ethyl, n-propyl, isopropyl, butyl, etc.; and the alkyl groups may have 1 to 3 hydroxyl groups. Preferably, w is 1 or 2, with 1 being more preferable.

Specific examples of amines represented by Formula I include methylamine, ethylamine, n-propylamine, isopropylamine, butylamine, dimethylamine, diethylamine, trimethylamine, triethylamine, piperidine, morpholine, ethanolamine, diethanolamine, triethanolamine, etc. Of these, methylamine, ethylamine, ethanolamine, triethanolamine, etc. are preferable, with methylamine and ethylamine being particularly preferable.

The amine salt of the monocarboxylic acid (2) may be used in the form of crystals, or in the form of aqueous solutions produced by mixing a monocarboxylic acid and an amine in water, and neutralizing the mixture.

The salt of the polycarboxylic acid in (3) contained in the residue-removing solution (A) refers to a salt formed from substantially equimolar amounts of carboxyl groups of the polycarboxylic acid that forms a 7- or more-membered ring chelate with copper and at least one member selected from the group consisting of ammonia, amines, and quaternary ammonium compounds. Specifically, it refers to a salt in which all of the carboxyl groups form salts. For example, in the case that the polycarboxylic acid is a succinic acid having two carboxyl groups, it is a salt that contains about 2 moles of at least one member selected from the group consisting of ammonia, amines, and quaternary ammonium compounds with respect to 1 mole of succinic acid (the number of moles of carboxyl groups is 2).

The polycarboxylic acid that forms a 7- or more-membered ring chelate with copper, which forms the salt (3) contained in the residue-removing solution (A), refers to a polycarboxylic acid in which a plurality of carboxyl groups in the molecules coordinates to copper or copper ions, thereby forming a chelate, and the chelate forms a 7- or more-membered ring. Preferable examples thereof include polycarboxylic acids that form a 7- to 9-membered ring, preferably a 7- or 8-membered ring, particularly preferably a 7-membered ring chelate. The polycarboxylic acids as described above are preferably used because of their high ability to remove residues and significant effect of reducing the occurrence of Cu corrosion, cracking, and surface roughness.

Specific examples of the polycarboxylic acid include $C_4$-$C_8$ polycarboxylic acids. Specific examples thereof include aliphatic $C_4$-$C_6$ dicarboxylic acids such as succinic acid, glutaric acid, adipic acid, etc., with succinic acid or glutaric acid being preferable, and succinic acid being more preferable.

Examples of amines to form the amine salt in (3) include amines represented by Formula II:

$$R^2_x H_{3-x} N \qquad \text{II}$$

wherein x represents an integer from 1 to 3; $R^2$ is an alkyl group that may be substituted with a hydroxyl group; and when x is 2 or 3, each $R^2$ may be the same or different, or two $R^2$s may be bonded to each other to form a ring, and carbons that form the ring may be substituted with heteroatoms.

Examples of $R^2$ include $C_1$-$C_4$ alkyl groups such as methyl, ethyl, n-propyl, isopropyl, butyl, etc., and the alkyl groups may have 1 to 3 hydroxyl groups. Preferably, x is 1 or 2, with 1 being more preferable. Further, a higher pKa of the amine is better.

Specific examples of amines represented by Formula II include methylamine, ethylamine, n-propylamine, isopropylamine, butylamine, dimethylamine, diethylamine, trimethylamine, triethylamine, piperidine, morpholine, ethanolamine, diethanolamine, triethanolamine, etc. Of these, methylamine, ethylamine, butylamine, triethanolamine, etc. are preferable, with methylamine and ethylamine being particularly preferable.

Examples of quaternary ammonium compounds that form the quaternary ammonium salt in (3) include tetraalkylammonium, preferably tetra($C_1$-$C_4$ alkyl)ammonium. Specific examples include tetramethylammonium, tetraethylammonium, etc., with tetramethylammonium being preferable.

Preferable specific examples of the salt (3) of the polycarboxylic acid that forms a 7- or more-membered ring chelate with copper include: ammonium salt, methylamine salt, ethylamine salt, triethanolamine salt, and tetramethyl ammonium salt of succinic acid; ammonium salt, methylamine salt, ethylamine salt, tetramethyl ammonium salt of glutaric acid; and the like. More preferable examples are ammonium salt, methylamine salt, and tetramethyl ammonium salt of succinic acid; and ammonium salt, methylamine salt, and tetramethyl ammonium salt of glutaric acid.

The salt (3) of the polycarboxylic acid that forms a 7- or more-membered ring chelate with copper may be used in the form of crystals, or in the form of aqueous solutions produced by mixing acids and bases of the above-described salts in water, and neutralizing the mixtures. Further, the salt (3) of the polycarboxylic acid may be any of ammonium salt, amine salt, or quaternary ammonium salt, and a mixture of two or more of these may be used.

The proportion (concentration) of the salt (2) and/or the salt (3) in the residue-removing solution can be suitably selected according to the amount and nature of residues to be removed after a dry process. The concentration of the salt (2) and/or the salt (3) in the residue-removing solution is usually 0.05 to 30 wt %, preferably 0.1 to 15 wt %, more preferably 0.3 to 10 wt %. Adjusting the concentration of the polycarboxylic acid within the above-described ranges is preferable because the resulting residue-removing solution is soluble, low in viscosity, and low in cost.

The proportion of the water (4) contained in the residue-removing solution of the present invention can be determined according to the proportion of components other than the water. For example, it is usually about 60 to 99.9 wt %, preferably about 83 to 99.4 wt % in the residue-removing solution.

The residue-removing solution (A) of the present invention can be prepared in the proportion as described above. It can also be prepared by individually or simultaneously dissolving, in water, the Brønsted acid (1) whose pKa is at least 3 at 25° C., the amine salt (2) of the monocarboxylic acid and/or at least one member (3) selected from the group consisting of an ammonium salt, an amine salt, and a quaternary ammonium salt of the polycarboxylic acid that forms a 7- or more-membered ring chelate with copper. Needless to say, each salt (2) and/or salt (3) can be prepared by individually or simultaneously dissolving acids and bases in water.

When the salt contained in the residue-removing solution is the amine salt (2) of the monocarboxylic acid, the pH of the residue-removing solution of the present invention is equal to or less than the pKa of the monocarboxylic acid in (2) at 25° C., preferably less than the pKa. Specifically, the pH is 4 to 6, preferably 4 to 5.5, more preferably 4 to 5, particularly preferably 4 to 4.5.

When the salt contained in the residue-removing solution is at least one member (3) selected from the group consisting of an ammonium salt, an amine salt, and a quaternary ammonium salt of the polycarboxylic acid that forms a 7- or more-membered ring chelate with copper, the pH of the residue-removing solution is equal to or less than the $pKa_2$ of the polycarboxylic acid in (3) at 25° C., preferably less than the $pKa_2$. Specifically, the pH is 4 to 6, preferably 4 to 5.5, more preferably 4 to 5, particularly preferably 4.5 to 5.

Further, when (2) and (3) coexist, the pH of the residue-removing solution is equal to or less than the pKa of the monocarboxylic acid at 25° C. or $pKa_2$ of the polycarboxylic acid at 25° C., whichever is greater (pKa or $pKa_2$), preferably less than the pKa or $pKa_2$, whichever is greater. Specifically, the pH is 4 to 6, preferably 4 to 5.5, more preferably 4 to 5, particularly preferably 4.5 to 5.

For reference, the pKa (or $pKa_2$) of various carboxylic acids at 25° C. are shown below.

Acetic acid: pKa=4.56
Propionic acid: pKa=4.67
Succinic acid: $pKa_2$=5.24
Glutaric acid: $pKa_2$=5.03
Adipic acid: $pKa_2$=5.03

The residue-removing solution having a pH within the above ranges is preferable because it has a high ability to remove residues, is capable of dramatically reducing Cu corrosion as well as cracking and roughness of the Cu surface, and causes only minor damage to low-k films.

Residue-Removing Solution (B)

The amine salt (5) of the monocarboxylic acid contained in the residue-removing solution (B) refers to a salt formed from substantially equimolar amounts of monocarboxylic acid and amine. Examples of monocarboxylic acids to form the amine salt (5) of the monocarboxylic acid include $C_1$-$C_8$ monocarboxylic acids. Specific examples thereof include aliphatic $C_1$-$C_4$ monocarboxylic acids such as formic acid, acetic acid, propionic acid, trifluoroacetic acid, etc., with acetic acid being preferable.

Examples of amines to form the amine salt (5) include amines represented by Formula III:

$$R^3_y H_{3-y} N \qquad \text{III}$$

wherein y represents an integer from 1 to 3; $R^3$ is an alkyl group that may be substituted with a hydroxyl group; and when y is 2 or 3, each $R^3$ may be the same or different, or two $R^3$s may be bonded to each other to form a ring, and carbons that form the ring may be substituted with heteroatoms.

Examples of $R^3$ include $C_1$-$C_4$ alkyl groups such as methyl, ethyl, n-propyl, isopropyl, butyl, etc.; and the alkyl groups may have 1 to 3 hydroxyl groups. Preferably, y is 1 or 2, with 1. being more preferable.

Specific examples of amines represented by Formula III include methylamine, ethylamine, n-propylamine, isopropylamine, butylamine, dimethylamine, diethylamine, trimethylamine, triethylamine, piperidine, morpholine, ethanolamine, diethanolamine, triethanolamine, etc. Of these, methylamine, ethylamine, ethanolamine, triethanolamine, etc. are preferable, with methylamine and ethylamine being particularly preferable.

The amine salt (5) may be used in the form of crystals, or in the form of aqueous solutions produced by mixing a monocarboxylic acid and an amine in water, and neutralizing the mixture.

The amine salt (6) of the polycarboxylic acid that forms a 7- or more-membered ring chelate with copper contained in the residue-removing solution (B) refers to a salt formed from substantially equimolar amounts of amine and polycarboxylic acid that forms a 7- or more-membered ring chelate with copper. Specifically, it refers to a salt in which all of the carboxyl groups form salts. For example, in the case of succinic acid in which the polycarboxylic acid has two carboxyl groups, it is a salt that contains about 2 moles of amine with respect to 1 mole of succinic acid (the number of moles of carboxyl groups is 2).

Any one of the salts described in (3) contained in the residue-removing solution (A) may be selected as the polycarboxylic acid that forms a 7- or more-membered ring chelate with copper, which forms the salt (6) contained in the residue-removing solution (B). Examples of the polycarboxylic acid include $C_4$-$C_6$ dicarboxylic acids. Specific examples include aliphatic $C_4$-$C_6$ dicarboxylic acids such as succinic acid, glutaric acid, adipic acid, etc., with succinic acid or glutaric acid being preferable, and succinic acid being more preferable.

Examples of amines to form the amine salt (6) include amines represented by Formula IV:

$$R^4_z H_{3-z} N \qquad \text{IV}$$

wherein z represents an integer from 1 to 3; $R^4$ is an alkyl group that may be substituted with a hydroxyl group; and when z is 2 or 3, each $R^4$ may be the same or different, or two $R^4$s may be bonded to each other to form a ring, and carbons that form the ring may be substituted with heteroatoms.

Examples of $R^4$ include $C_1$-$C_4$ alkyl groups such as methyl, ethyl, n-propyl, isopropyl, butyl, etc., and the alkyl groups may have 1 to 3 hydroxyl groups. Preferably, z is 1 or 2, with 1 being more preferable. Further, a higher pKa of the amine is better.

Specific examples of amines represented by Formula IV include methylamine, ethylamine, n-propylamine, isopropylamine, butylamine, dimethylamine, diethylamine, trimethylamine, triethylamine, piperidine, morpholine, ethanolamine, diethanolamine, triethanolamine, etc. Of these, methylamine, ethylamine, ethanolamine, triethanolamine, etc. are preferable, with methylamine and ethylamine being particularly preferable.

The amine salt (6) may be used in the form of crystals, or in the form of aqueous solutions produced by mixing a polycarboxylic acid and an amine in water, and neutralizing the mixture.

The proportion (concentration) of the salt (5) and/or the salt (6) in the residue-removing solution can be suitably selected according to the amount and nature of residues to be removed after a dry process. The concentration of the salt (5) and/or the salt (6) in the residue-removing solution is usually 0.05 to 30 wt %, preferably 0.1 to 15 wt %, more preferably 0.2 to 10 wt %, particularly preferably 0.5 to 8 wt %. Adjusting the concentration of the salt (5) and/or the salt (6) within the above-described ranges is preferable because the resulting residue-removing solution has a high ability to remove residues, and causes only minor Cu corrosion.

The proportion of the water (7) contained in the residue-removing solution of the present invention can be determined according to the proportion of components other than the water. For example, it is usually about 70 to 99.95 wt %, preferably about 90 to 99.9 wt % in the residue-removing solution.

The residue-removing solution (B) of the present invention can be prepared in the proportion described above. It can also be prepared by individually or simultaneously dissolving, in water, the amine salt (5) of the monocarboxylic acid and the salt (6) of the polycarboxylic acid that forms a 7- or more-membered ring chelate with copper. Needless to say, each salt in (5) and/or (6) can be prepared by individually or simultaneously dissolving acids and bases in water.

When the salt contained in the residue-removing solution is the amine salt (5) of the monocarboxylic acid, the pH of the residue-removing solution of the present invention is equal to or greater than the pKa of the monocarboxylic acid in (5) at 25° C., preferably greater than the pKa. Specifically, the pH is 6 to 9.5, preferably 6 to 8, more preferably 6.5 to 7.5.

When the salt contained in the residue-removing solution is the amine salt (6) of the polycarboxylic acid that forms a 7- or more-membered ring chelate with copper, the pH of the residue-removing solution is equal to or greater than the $pKa_2$ of the polycarboxylic acid in (6) at 25° C., preferably greater than the $pKa_2$. Specifically, the pH is 6 to 9.5, preferably 6 to 8, more preferably 6.5 to 7.5.

Further, when the (5) and (6) coexist, the pH of the residue-removing solution is equal to or greater than the pKa of the monocarboxylic acid at 25° C. or $pKa_2$ of the polycarboxylic acid at 25° C., whichever is greater (pKa or $pKa_2$), preferably greater than the pKa or $pKa_2$, whichever is greater. Specifically, the pH is 6 to 9.5, preferably 6 to 8, more preferably 6.5 to 7.5.

The residue-removing solution having a pH within the above ranges is preferable because it has a high ability to remove residues, is capable of dramatically reducing Cu corrosion as well as cracking and roughness of the Cu surface, and causes only minor damage to low-k films.

Additives that may be Contained in Residue-Removing Solution (A) or (B)

A fluorine-containing compound and a neutral organic compound containing an oxygen atom that can coordinate to Cu may be added to the residue-removing solution (A) or (B). This enhances the effect of removing residues adhering to side walls of a pattern made of an interlayer dielectric such as a low-k film.

The above-described residues include Cu degradation products, and residues of the stopper film such as SiN, low-k film, filling material, and the like sputtered by dry etching; and may contain Si and organic substances. Even if the residues include Si and organic substances, when Cu oxide is the principal constituent of the residues, the residues can usually be removed by the residue-removing solutions (A) and (B) of the present invention without adding a fluorine-containing compound. Moreover, an interlayer dielectric such as a low-k film that has been plasma-damaged in a dry process is easily etched with a fluorine-containing compound, sometimes preventing the substrate from being processed to the dimensions as designed. For this reason, when the residues cannot be sufficiently removed, or when it is unclear whether the residues have been removed, a small amount of a fluorine-containing compound may be added to impart a greater effect of removal.

Examples of fluorine-containing compounds that may be added to the residue-removing solution of the present invention include hydrogen fluoride; fluoride salts of ammonia, hydroxylamine, primary, secondary and tertiary amines, quaternary ammonium compounds, polyamines; etc. Specifically, preferable examples include hydrogen fluoride, ammonium fluoride, ammonium hydrogen difluoride, methylamine fluoride, ethylamine fluoride, diethylamine fluoride, triethylenetetramine fluoride, tetramethylammonium fluoride, and the like. These fluorine-containing compounds may be used alone, or in a combination of two or more thereof. In one embodiment of the present invention, for example, aqueous ammonium fluoride solution and diluted fluoric acid (50 wt % aqueous solution) can be used.

The concentration of the fluorine-containing compound can be suitably selected according to the types and amounts of the interlayer dielectric, such as a silicon-containing film or a low-k film; and the interlayer dielectric that has been plasma-damaged in a dry process.

The proportion (concentration) of the fluorine-containing compound in the residue-removing solution is preferably 0.001 to 10 wt %, more preferably 0.01 to 5 wt %. When it is necessary to inhibit the plasma-damaged portion of the interlayer dielectric from being etched with the residue-removing solution of the present invention, a fluorine-containing compound is preferably not added, or only a small amount (1 wt % or less) of a fluorine-containing compound is preferably added. If, however, the amount of the fluorine-containing compound is less than 0.001 wt %, the residue-removing effect may decrease.

When a neutral organic compound containing an oxygen atom that can coordinate to the below-described Cu is added to the residue-removing solution of the present invention, the degree of dissociation of the fluorine-containing compound decreases; thus, a large amount of fluorine-containing compound is preferably added to impart an effect equal to that obtained with only an aqueous solution not containing the neutral organic compound. If, however, the amount of fluorine-containing compound exceeds 5 wt %, the plasma-damaged portion of the interlayer dielectric may be etched, preventing the substrate from being processed to the dimensions as designed.

The neutral organic compound which contains an oxygen atom that can coordinate to Cu and which may be added to the residue-removing solution of the present invention is preferably a neutral organic solvent with two or more oxygen atoms, or an oxygen atom-containing neutral organic solvent with a hydrophobic group such as a long-chain alkyl group or the like. These organic solvents enhance the removing effect for residues adhering to the side walls of the pattern made of an interlayer dielectric such as a low-k film and residues on the surface of the interlayer dielectric substrate, and impart the effect of preventing Cu corrosion. The term "neutral organic solvent" denotes solvents other than protogenic solvents (acidic solvents) and protophilic solvents (basic solvents).

Examples of such neutral organic compounds include polycarbonyls; hydroxy ketones; esters such as carbonate esters, cyclic esters, keto acid esters, oxyesters, and alkoxy esters; alcohols such as monohydric alcohols, polyhydric alcohols, and alkoxy alcohols; polyethers; and the like.

Examples of polycarbonyls include 2,3-butanedione, 2,4-pentadione, methylglyoxal, and the like. 2,3-Butanedione and 2,4-pentadione are preferred.

Examples of hydroxy ketones include acetoin, acetone alcohol, diacetone alcohol, and the like. Acetoin and acetone alcohol are preferred.

Examples of esters include carbonate esters such as dimethyl carbonate and diethyl carbonate; cyclic esters such as propylene carbonate, ethylene carbonate, and γ-butyrolactone; keto acid esters such as methyl acetoacetate and ethyl acetoacetate; oxyesters such as methyl lactate, ethyl lactate, and butyl lactate; alkoxy esters such as ethylene glycol monomethyl ether acetate, ethylene glycol monoethyl ether acetate, ethylene glycol mono-n-butyl ether acetate, diethylene glycol monomethyl ether acetate, diethylene glycol monoethyl ether acetate, diethylene glycol mono-n-butyl ether acetate, ethylene glycol diacetate (ethylene diacetate), propylene glycol monomethyl ether acetate (PGMEA), and propylene glycol monoethyl ether acetate. Preferable examples include propylene carbonate, rbutyrolactone, ethylene diacetate, PGMEA, methyl acetoacetate, ethyl acetoacetate, ethyl lactate, ethylene glycol monoethyl ether acetate, and the like.

Examples of alcohols include monohydric alcohols with long-chain (e.g., $C_3$-$C_6$) alkyl groups or like hydrophobic groups, such as isopropyl alcohol, 1-butanol, tert-butyl alcohol, and isobutyl alcohol; polyhydric alcohols such as ethylene glycol, diethylene glycol, triethylene glycol, tetraethylene glycol, polyethylene glycol, propylene glycol, dipropylene glycol, poly(propylene glycol), glycerin, 2-amino-2-ethyl-1,3-propanediol, 2-amino-2-methyl-1,3-propanediol, 1,2-cyclohexanediol, 2,2-dimethyl-1,3-propanediol, 2,5-dimethyl-2,5-hexanediol, 2,3-naphthalenediol, 1,2-butanediol, 1,3-butanediol, 1,4-butanediol, 2-butyne-1,4-diol, 2-butene-1,4-diol, 1,3-propanediol, 1,2-propanediol, DL-1,2-hexanediol, 2,5-hexanediol, 1,2-benzenediol, 2,4-pentanediol, and 2-methyl-2,4-pentanediol; alkoxy alcohols such as ethylene glycol monomethyl ether, ethylene glycol monoethyl ether, ethylene glycol mono-n-butyl ether, ethylene glycol monophenyl ether, diethylene glycol monomethyl ether, diethylene glycol monoethyl ether, diethylene glycol monoisobutyl ether, diethylene glycol mono-n-butyl ether, diethylene glycol monobenzyl ether, diethylene glycol monohexyl ether, diethylene glycol monobenzyl ether, triethylene glycol monomethyl ether, triethylene glycol monobutyl ether, tripropylene glycol monomethyl ether, tetraethylene glycol monomethyl ether, tetraethylene glycol mono-n-dodecyl ether, heptaethylene glycol mono-n-dodecyl ether, and polyethylene glycol monomethyl ether. Preferable examples thereof include isopropyl alcohol, 1-butanol, isobutyl alcohol, diethylene glycol, dipropylene glycol, triethylene glycol, tetraethylene glycol, triethylene glycol monomethyl ether, and the like.

Examples of polyethers include dimethoxymethane, diethoxymethane, dimethoxyethane, dimethoxypropane, ethylene glycol dimethyl ether, ethylene glycol methyl ethyl ether, ethylene glycol diethyl ether, ethylene glycol di-n-butyl ether, diethylene glycol dimethyl ether, diethylene glycol methyl ethyl ether, diethylene glycol diethyl ether, diethylene glycol di-n-butyl ether, triethylene glycol dimethyl ether, triethylene glycol ethylmethyl ether, triethylene glycol diethyl ether, tetraethylene glycol dimethyl ether, tetraethylene glycol diethyl ether, polyethylene glycol dimethyl ether, and the like. Preferable examples thereof include ethylene glycol dimethyl ether, diethylene glycol dimethyl ether, diethylene glycol diethyl ether, triethylene glycol dimethyl ether, tetraethylene glycol dimethyl ether, and the like.

Among the above-mentioned neutral organic compounds, preferable compounds are 2,3-butanedione, 2,4-pentadione, acetylacetone, acetoin, propylene carbonate, γ-butyrolactone, ethylene glycol mono-n-butyl ether acetate, diethylene glycol monoethyl ether acetate, diethylene glycol mono-n-butyl ether acetate, ethylene glycol diacetate (ethylene diacetate), propylene glycol monomethyl ether acetate (PGMEA), isopropyl alcohol, 1-butanol, tert-butyl alcohol, isobutyl alcohol, diethylene glycol, dipropylene glycol, triethylene glycol, tetraethylene glycol, glycerin, 2,2-dimethyl-1,3-propanediol, 1,3-propanediol, 2-methyl-2,4-pentanediol, ethylene glycol mono-n-butyl ether, ethylene glycol monophenyl ether, diethylene glycol monomethyl ether, diethylene glycol monoethyl ether, diethylene glycol mono-n-butyl ether, triethylene glycol monomethyl ether, triethylene glycol monobutyl ether, tripropylene glycol monomethyl ether, dimethoxymethane, ethylene glycol dimethyl ether, diethylene glycol dimethyl ether, diethylene glycol diethyl ether, triethylene glycol dimethyl ether, tetraethylene glycol dimethyl ether, methyl acetoacetate, ethyl acetoacetate, and ethyl lactate.

More preferable compounds are 2,3-butanedione, 2,4-pentadione, acetoin, propylene carbonate, γ-butyrolactone, diethylene glycol monoethyl ether acetate, ethylene glycol diacetate (ethylene diacetate), propylene glycol monomethyl ether acetate (PGMEA), ethylene glycol monoethyl ether acetate, isopropyl alcohol, 1-butanol, isobutyl alcohol, diethylene glycol, dipropylene glycol, triethylene glycol, tetraethylene glycol, triethylene glycol monomethyl ether, ethylene glycol dimethyl ether, diethylene glycol dimethyl ether, diethylene glycol diethyl ether, triethylene glycol dimethyl ether, tetraethylene glycol dimethyl ether, methyl acetoacetate, ethyl acetoacetate, and ethyl lactate.

Particularly preferable compounds are 2,3-butanedione, acetoin, propylene carbonate, diethylene glycol monoethyl ether acetate, ethylene glycol diacetate (ethylene diacetate), propylene glycol monomethyl ether acetate (PGMEA), ethylene glycol monoethyl ether acetate, isopropyl alcohol, diethylene glycol, triethylene glycol, tetraethylene glycol, triethylene glycol monomethyl ether, ethylene glycol dimethyl ether, diethylene glycol dimethyl ether, triethylene glycol dimethyl ether, methyl acetoacetate, ethyl acetoacetate, and ethyl lactate. These neutral organic compounds are preferable because they have a high effect of removing residues, and are easily available at low cost.

The proportion (concentration) of the neutral organic compound containing an oxygen atom that can coordinate to Cu is usually 0.1 to 60 wt %, preferably 2 to 40 wt % in the residue-removing solution.

A Cu surface-protective agent may further be added to the residue-removing solution of the present invention. Usable Cu surface-protective agents are not particularly limited, and preferable examples include a surface-protecting agent described as follows: At least one compound selected from the group consisting of (i) a compound comprising, as a basic skeleton, a five-membered heteroaromatic compound (excluding compounds having three consecutive N atoms) having a structure represented by Formula: =N—NH—, wherein the pH of an aqueous solution of the compound (10 ppm, 23° C.) is 7 or less, (ii) a compound comprising, as a basic skeleton, a five-membered hetero compound having a structure represented by Formula: —N=C(SH)—X— (wherein X represents NH, O, or S), wherein the pH of an aqueous solution of the compound (10 ppm, 23° C.) is 7 or less, and (iii) a compound comprising, as a basic skeleton, a six-membered heteroaromatic compound having at least one nitrogen atom (N), wherein the pH of an aqueous solution of the compound (10 ppm, 23° C.) is 7 or greater.

The pH of the aqueous solutions (10 ppm, 23° C.) of Compounds (i) and (ii) is adjusted to 7 or less, preventing protons from easily binding to lone pairs of the nitrogen atoms in these molecules. The pH is preferably 3 to 7, more preferably 4 to 6.5. The pH of the aqueous solution (10 ppm, 23° C.) of Compound (iii) is adjusted to 7 or greater, allowing protons to easily bind to lone pairs of nitrogen atoms in these molecules. The pH is preferably 7 to 11, more preferably 8 to 10.

Compound (i) may be any compound containing, as a basic skeleton, a five-membered heteroaromatic compound having a structure represented by Formula =N—NH— (excluding compounds having three consecutive N atoms). It may also be a compound having another aromatic ring (e.g., a benzene ring) fused to the basic skeleton. Compound (i) is defined as a so-called n-excessive N-heteroaromatic compound. The compound may have substituent(s) on its ring. For example, it may have 1 to 3 substituents such as alkyl groups (preferably $C_1$-$C_3$ alkyl groups), hydroxyl group, amino group, nitro group, halogen atoms (e.g., fluorine, chlorine, bromine atoms, etc.), carboxyl groups, etc.

Specific examples of Compound (i) include indazoles, pyrazoles, 1,2,4-triazoles, etc. More specific examples of indazoles include indazole, 3-hydroxyindazole, 3-chloro-1H-indazole, 5-aminoindazole, 5-nitroindazole, 6-nitroindazole, indazole-3-carboxylic acid, 3-bromo-7-nitroindazole, 7-nitroindazole, etc. More specific examples of pyrazoles include pyrazole, 3,5-dimethylpyrazole, etc. More specific examples of 1,2,4-triazoles include 1,2,4-triazole, etc. Of these, indazole, 3-chloro-1H-indazole, and 5-nitroindazole are preferable. Indazole, 5-nitroindazole, indazole-3-carboxylic acid are the most preferable.

The Cu surface-protective agent comprising Compound (i) has an excellent property to prevent all of oxidation, cracking, and roughness of the Cu surface. Accordingly, it is the most preferable as a Cu surface-protective agent to be contained in the residue-removing solution.

Compound (ii) may also be any compound containing, as a basic skeleton, a five-membered hetero compound having a structure represented by Formula: —N=C(SH)—X—, wherein X represents NH, O, or S. It may also be a compound having another aromatic ring (e.g., a benzene ring) fused to the basic skeleton. Compound (ii) is defined as a so-called π-excessive N-, O-, or S-heteroaromatic compound. The compound may have substituent(s) on its ring. For example, it may have 1 to 3 substituents such as alkyl groups (preferably $C_1$-$C_3$ alkyl groups), hydroxyl group, amino group, nitro group, halogen atoms (e.g., fluorine, chlorine, bromine atoms, etc.), carboxyl groups, etc.

Specific examples of Compound (ii) include mercaptoimidazoles, mercaptooxazoles, mercaptothiazoles, mercaptothiazolines, mercaptobenzimidazoles, mercaptobenzoxazoles, mercaptobenzothiazole, or the like. More specific examples include 2-mercaptobenzimidazole, 2-mercaptoimidazole, 2-mercapto oxazole, 2-mercaptobenzoxazole, 2-mercaptothiazole, 2-mercaptobenzothiazole, 2-thiazoline-2-thiol, etc. Of these, 2-mercaptobenzimidazole, 2-mercaptobenzoxazole, 2-mercaptobenzothiazole, and 2-thiazoline-2-thiol are preferable. 2-Mercaptobenzoxazole, 2-mercaptobenzothiazole, and 2-thiazoline-2-thiol are the most preferable.

The Cu surface-protective agent comprising Compound (ii) has an excellent property to mainly prevent oxidation and roughness of the Cu surface.

Compound (iii) may be any compound containing, as a basic skeleton, a six-membered heteroaromatic compound having at least one nitrogen atom (N). It may also be a compound having another aromatic ring (e.g., a benzene ring) fused to the basic skeleton. Compound (iii) is defined as a so-called n-deficient N-heteroaromatic compound. The compound may have substituent(s) on its ring. For example, it may have 1 to 3 substituents such as alkyl groups (preferably $C_1$-$C_3$ alkyl groups), hydroxyl group, amino group, nitro group, halogen atoms (e.g., fluorine, chlorine, bromine atoms, etc.), carboxyl groups, etc.

Specific examples of Compound (iii) above include pyridines, pyrimidines, pyridazines, pyrazines, quinolines, quinazolines, quinoxalines, cinnolines, etc. More specific examples include methylpyridine, aminopyridine, 2,4-diaminopyrimidine, 2,4,6-triaminopyrimidine, pyridazine, 3-aminopyrazine-2-carboxylic acid, 4-aminoquinoline, etc. Of these, 2,4-diaminopyrimidine and 2,4,6-triaminopyrimidine are preferable. 2,4,6-triaminopyrimidine is the most preferable.

The Cu surface-protective agent comprising Compound (iii) has an excellent ability to mainly prevent roughness of the Cu surface.

Cracking, roughness and oxidation of the Cu surface are believed to occur due to different reasons. Therefore, these problems cannot always be prevented using only one Cu surface-protective agent. In order to enhance the effect of preventing these problems, a mixture of two or more of the above-mentioned compounds is preferably used according to the Cu surface condition.

The Cu surface-protective agent is expensive, and the addition of an excess amount of the Cu surface-protective agent will reduce the ability to remove the residues after a dry process. Therefore, a smaller amount of the Cu surface-protective agent is better, as long as it is within a range of concentrations in which the effect can be obtained and continued. In order to achieve a continued effect, the amount of the Cu surface-protective agent in the residue-removing solution is about 0.1 to 4,000 ppm, preferably about 0.25 to 2,000 ppm.

The concentration of the Cu surface-protective agent comprising Compound (i) above is usually about 0.1 ppm to 3,000 ppm. However, when the residue-removing solution does not contain a substance having a carboxyl group, or when the residue-removing solution contains a substance having a carboxyl group and has a pH equal to or greater than the pKa of the substance having a carboxyl group, the concentration of the Cu surface-protective agent is usually 0.1 ppm to 100 ppm, preferably 0.1 ppm to 10 ppm, more preferably 0.1 ppm to 1 ppm.

When the residue-removing solution contains a substance having a carboxyl group and has a pH less than the pKa of the substance having a carboxyl group, the concentration of the Cu surface-protective agent comprising Compound (i) is 1 ppm to 3,000 ppm, preferably 5 ppm to 2,000 ppm, more preferably 100 ppm to 1,000 ppm.

Because Compound (i) is generally only slightly soluble in water, the concentration of Compound (i) used is often limited due to the solubility. Moreover, the addition of a large amount of Compound (i) may reduce the ability to remove the residues after a dry process. In order to increase the solubility of the Cu surface-protective agent and prevent the ability to remove the residues from decreasing due to the addition of the Cu surface-protective agent, it is preferable that an organic solvent be added as required to the residue-removing solution in an amount of 10 wt % or more, preferably about 10 to 50 wt %. When the residue-removing solution contains a substance having a carboxyl group and has a pH less than the pKa of the substance having a carboxyl group, and the concentration of the Cu surface-protective agent is equal to or greater than 100 ppm, the residue-removing solution usually contains an organic solvent.

The concentration of the Cu surface-protective agent comprising Compound (ii) is 0.1 ppm to 50 ppm, preferably 0.1 ppm to 5 ppm, more preferably 0.1 ppm to 1 ppm.

The concentration of the Cu surface-protective agent comprising Compound (iii) is 10 ppm to 1,000 ppm, preferably 50 ppm to 500 ppm, more preferably 100 ppm to 300 ppm.

In the case of a mixture of any of Compounds (i) to (iii), the content (concentration) of at least two of these compounds is preferably 0.2 ppm to 3,000 ppm.

The residue-removing solution of the present invention may further contain a surfactant. Such a surfactant can be used to increase the wettability of the hydrophobic interlayer dielectric, and to prevent a situation wherein the residue-removing solution is not uniformly distributed according to the shape of the pattern. The surfactant is not particularly limited, and may be a cationic, anionic, nonionic, or a like surfactant.

Specific examples of cationic surfactants include primary amines represented by $RNH_2$; secondary amines represented by $R_2NH$; tertiary amines represented by $R_3N$; quaternary amines represented by $[R_4N]M'$ (R is a hydrogen atom or a straight or branched $C_1$-$C_{12}$ alkyl group that may be substituted with a fluorine atom or an OH group, or a phenyl group that may be substituted with a fluorine atom or an OH group; M' is a monovalent anion); and the like. Specific examples include $CH_3(CH_2)_nNH_2$, $(CH_3(CH_2)_n)_2NH$, $(CH_3(CH_2)_n)_3N$, $(CH_3(CH_2)_n)_4NCl$, $CH_3(CH_2)_nN((CH_2)_nOH)_2$, $CF_3(CF_2)_nNH_2$, $(CF_3(CF_2)_n)_2NH$, $(CF_3(CF_2)_n)_3N$, $(CF_3(CF_2)_n)_4NCl$, $CF_3(CF_2)_nN((CH_2)_nOH)_2$, $C_6H_5NH_2$, $(CH_3)_2(CH_2)_nNH_2$ (n is an integer of 1 to 30), etc.

Preferable examples of anionic surfactants include carboxylic acid-type, sulfonic acid-type, or sulfate-type surfactants in which a hydrophilic group is —COOM, —$SO_3M$, or —$OSO_3M$ (M is a hydrogen atom, metal atom, or ammonium), respectively.

Specific examples of carboxylic acid-type surfactants include those represented by $CF_3(CF_2)_nCOOH$, $(CF_3)_2CF(CF_2)_nCOOH$, $HCF_2(CF_2)_nCOOH$, $CF_3(CF_2)_n(CH_2)_mCOOH$, $CF_3(CF_2)_nCF=CH(CH_2)_mCOOH$, and $Cl(CF_2CFCl)_pCF_2COOH$ (n is an integer of 2 to 17, m is an integer of 1 or 2, and p is an integer of 1 to 9), their alkali metal salts, ammonium salts, primary amine salts, secondary amine salts, and tertiary amine salts, etc.

Further examples of sulfonic acid-type surfactants and sulfate-type surfactants include $C_nH_{2n+1}SO_3M$, $C_nH_{2n+1}O(CH_2CH_2O)_mSO_3M$, $C_nH_{2n+1}PhSO_3M$, $C_nH_{2n+1}PhO(CH_2CH_2O)_mSO_3M$ or $C_nH_{2n+1}Ph(SO_3H)OPhSO_3M$ (M is a hydrogen atom, metal atom, or ammonium; Ph is a phenylene group; n is an integer of 5 to 20; and m is an integer of 0 to 20). Specific examples thereof include those represented by $C_{12}H_{25}O(CH_2CH_2O)_2SO_3H$, $C_9H_{19}PhO(CH_2CH_2O)_4SO_3H$, $C_{12}H_{25}O(CH_2CH_2O)_4SO_3H$, $C_6F_{11}PhSO_3H$, $C_9F_{17}OPhSO_3H$, and $RCH=CH(CH_2)_nSO_3H$ (R is a hydrocarbon group in which a hydrogen atom may be substituted with a fluorine atom); those represented by $C_{12}H_{25}OSO_3H$ and $C_{12}H_{25}Ph(SO_3H)OPhSO_3H$; their metal salts, ammonium salts, primary amine salts, secondary amine salts, tertiary amine salts, etc.

Preferable examples of nonionic surfactants include polyethylene glycol-type surfactants in which a hydrophilic group is represented by —R'$(CH_2CH_2O)_qR''$ or —R'O$(CH_2CH_2O)_qR''$ (R'' is a hydrogen atom or a $C_1$-$C_{10}$ alkyl group; R' is a $C_1$-$C_{20}$ hydrocarbon group in which a hydrogen atom may be substituted with a fluorine atom; and q is an integer of 0 to 20). Specific examples include $C_9F_{17}O(CH_2CH_2O)_rCH_3$ (r is an integer of 2 to 30), $C_9H_{19}Ph(CH_2CH_2O)_{10}H$, $C_{12}H_{25}O(CH_2CH_2O)_9H$, $C_9H_{19}PhO(CH_2CH_2O)_{10}H$, $C_9H_{19}PhO(CH_2CH_2O)_5H$, $C_8H_{17}PhO(CH_2CH_2O)_3H$, $C_8H_{17}Ph(CH_2CH_2O)_{10}H$ (Ph is a phenylene group), etc.

The proportion (concentration) of the surfactant in the residue-removing solution is usually 0.00001 to 5 wt %, preferably 0.0001 to 3 wt %. When the proportion is less than 0.00001 wt %, the surfactant effect tends to be small. When the proportion is greater than 5 wt %, a change in the effect is likely to be diminished.

Preferable Embodiments of Residue-Removing Solutions (A) and (B)

A preferable embodiment of the residue-removing solution (A) of the present invention is a residue-removing solution comprising 0.1 to 10 wt % (preferably 0.3 to 5 wt %, more preferably 0.5 to 3 wt %) of acetic acid or succinic acid as the Brønsted acid (1); 0.1 to 15 wt % (preferably 0.6 to 10 wt %, more preferably 1 to 6 wt %) of methylamine salt, ethylamine salt, or triethanolamine salt of acetic acid as the salt (2) of the monocarboxylic acid; and water (4). The pH thereof is 4 to 6 (preferably 4 to 5, more preferably 4.5 to 5).

Another embodiment of the residue-removing solution (A) of the present invention is a residue-removing solution comprising 0.1 to 10 wt % (preferably 0.3 to 5 wt %, more preferably 0.5 to 3 wt %) of acetic acid or succinic acid as the Brønsted acid (1); 0.1 to 15 wt % (preferably 0.6 to 10 wt %, more preferably 1 to 6 wt %) of methylamine salt or ethylamine salt of succinic acid or glutaric acid as the salt (3) of a polycarboxylic acid; and water (4). The pH thereof is 4 to 6 (preferably 4 to 5, more preferably 4.5 to 5).

Another embodiment of the residue-removing solution (A) of the present invention is a residue-removing solution comprising 0.1 to 10 wt % (preferably 0.3 to 5 wt %) of acetic acid or succinic acid as the Brønsted acid (1); 0.1 to 15 wt % (preferably 0.3 to 10 wt %, more preferably 1 to 6 wt %) of methylamine salt, ethylamine salt, or triethanolamine salt of acetic acid as the salt (2) of the monocarboxylic acid or methylamine salt or ethylamine salt of succinic acid or glutaric acid as the salt (3) of the polycarboxylic acid; 0.001 to 5 wt % (preferably 0.01 to 3 wt %, more preferably 0.01 to 1.5 wt %) of a fluorine-containing compound; and water (4). The pH thereof is 4 to 6 (preferably 4 to 5, more preferably 4.5 to 5).

Another embodiment of the residue-removing solution (A) of the present invention is a residue-removing solution comprising 0.1 to 10 wt % (preferably 0.3 to 5 wt %, more preferably 0.5 to 3 wt %) of acetic acid or succinic acid as the Brønsted acid (1); 0.1 to 15 wt % (preferably 0.3 to 10 wt %, more preferably 1 to 6 wt %) of methylamine salt, ethylamine salt, or triethanolamine salt of acetic acid as the salt (2) of the monocarboxylic acid or methylamine salt or ethylamine salt of succinic acid or glutaric acid as the salt (3) of the polycarboxylic acid; 0.001 to 5 wt % (preferably 0.01 to 3 wt %, more preferably 0.01 to 1.5 wt %) of a fluorine-containing compound; 0.5 to 60 wt % (preferably 1 to 30 wt %, more preferably 1 to 15 wt %) of a neutral organic compound containing an oxygen atom that can coordinate to Cu oxide; and water (4). The pH thereof is 4 to 6 (preferably 4 to 5, more preferably 4.5 to 5).

A preferable embodiment of the residue-removing solution (B) of the present invention is a residue-removing solution comprising 0.1 to 15 wt % (preferably 0.3 to 10 wt %, more preferably 1 to 7 wt %) of methylamine salt, ethylamine salt, or monoethanolamine salt of acetic acid as the amine salt (5) of the monocarboxylic acid; and water (7). The pH thereof is 6 to 9 (preferably 6 to 8, more preferably 6.5 to 7.5).

Another preferable embodiment of the residue-removing solution (B) of the present invention is a residue-removing solution comprising 0.1 to 20 wt % (preferably 0.3 to 15 wt %, more preferably 1 to 7 wt %) of methylamine salt or ethylamine salt of succinic acid or glutaric acid as the amine salt (6) of the polycarboxylic acid that forms a 7- or more-membered ring chelate with copper; and water (7). The pH is 6 to 9 (preferably 6 to 8, more preferably 6.5 to 7.5).

Another preferable embodiment of the residue-removing solution (B) of the present invention is a residue-removing solution comprising 0.1 to 15 wt % (preferably 0.3 to 10 wt %, more preferably 1 to 7 wt %) of methylamine salt, ethylamine salt, or monoethanolamine salt of acetic acid as the amine salt (5) of the monocarboxylic acid; 0.001 to 5 wt % (preferably 0.01 to 3 wt %, more preferably 0.1 to 3 wt %) of a fluorine-containing compound; and water (7). The pH thereof is 6 to 9 (preferably 6 to 8, more preferably 6.5 to 7.5).

Another preferable embodiment of the residue-removing solution (B) of the present invention is a residue-removing solution comprising 0.1 to 20 wt % (preferably 0.3 to 15 wt %, more preferably 1 to 7 wt %) of methylamine salt or ethylamine salt of succinic acid or glutaric acid as the amine salt (6) of the polycarboxylic acid that forms a 7- or more-membered ring chelate with copper; 0.01 to 10 wt % (preferably 0.1 to 7.5 wt %, more preferably 0.3 to 5 wt %) of a fluorine-containing compound; and water (7). The pH thereof is 6 to 9 (preferably 6 to 8, more preferably 6.5 to 7.5).

Another preferable embodiment of the residue-removing solution (B) of the present invention is a residue-removing solution comprising 0.1 to 15 wt % (preferably 0.3 to 10 wt %, more preferably 1 to 7 wt %) of methylamine salt, ethylamine salt, or monoethanolamine salt of acetic acid as the amine salt (5) of the monocarboxylic acid; 0.01 to 10 wt % (preferably 0.1 to 7.5 wt %, more preferably 0.3 to 5 wt %) of a fluorine-containing compound; 0.5 to 60 wt % (preferably 1 to 30 wt %, more preferably 1 to 15 wt %) of a neutral organic compound containing an oxygen atom that can coordinate to Cu oxide; and water (7). The pH thereof is 6 to 9 (preferably 6 to 8, more preferably 6.5 to 7.5).

Another preferable embodiment of the residue-removing solution (B) of the present invention is a residue-removing solution comprising 0.1 to 20 wt % (preferably 0.3 to 15 wt %, more preferably 1 to 7 wt %) of methylamine salt or ethylamine salt of succinic acid or glutaric acid as the amine salt (6) of the polycarboxylic acid that forms a 7- or more-membered ring chelate with copper; 0.01 to 10 wt % (preferably 0.1 to 7.5 wt %, more preferably 0.3 to 5 wt %) of a fluorine-containing compound; 0.5 to 60 wt % (preferably 1 to 30 wt %, more preferably 1 to 15 wt %) of a neutral organic compound containing an oxygen atom that can coordinate to Cu oxide; and water (7). The pH thereof is 6 to 8, more preferably 6.5 to 7.5.

Note that additives such as a Cu surface-protective agent, a surfactant, etc. can be added to any of the above preferable embodiments of the residue-removing solution (A) or (B), in an amount equal to the above-described proportion (concentration).

Target Residues to be Removed

Principal targets of the residue-removing solution of the present invention are Cu oxide films and residues after a dry process, which should be removed; and the Cu surface, which should be protected.

Examples of Cu oxide films include Cu oxide formed during dry etching and/or ashing, a native oxide film of Cu resulting from oxidation of the metal when the substrate is exposed to air during transfer from one process to another process, and the like. These Cu oxide films contain large amounts of CuO, $Cu_2O$, $Cu(OH)_2$, and the like in their compositions.

The residues after a dry process on a wafer on which a film is formed using Cu as a conductive metal are residues of Cu degradation products, including a Cu oxide film formed on the Cu surface of a Cu/low-k multilayer interconnect structure and/or Cu oxide formed as a result of dry etching and/or ashing. These residues mainly adhere to a Cu interconnect line having a pattern thereon, side walls of the pattern made of an interlayer dielectric such as a low-k film, and the surface of an interlayer dielectric substrate. The residues formed on the Cu are residues of a degradation product, which is a mixture of Cu oxide resulting from the oxidation and/or fluorination caused by damage from dry etching and/or ashing, and its Cu. These residues have an increased electrical resistance. The Cu degradation product comprises a mixture of Cu oxide resulting from the oxidation and/or fluorination, and its Cu. Consequently, the Cu degradation product forms an insulating layer whose electrical resistance thereof is similar to that of Cu oxide.

The residues adhering to the side walls of the pattern made of an interlayer dielectric such as a low-k film include, in addition to the Cu degradation products, residues of the stopper film such as SiN, low-k film, filling material, and the like sputtered by dry etching, and may contain Si and organic substances. The residues on the surface of the interlayer dielectric substrate are presumably the residues of organic substances such as the resist, anti-reflection film, and filling material that have not been removed by ashing, and residues after a process using an inorganic mask, which contain small amounts of Si and Cu degradation products that jumped from the bottom of holes and trenches during dry etching.

The term "interlayer dielectric" as used herein principally means a low-k film and a porous-low-k film; and also includes, for example, a fluorine-containing silicon oxide film (an FSG film). The term refers to an interlayer dielectric having a dielectric constant of from more than 1 to about 4 or less, preferably about 3 or less, more preferably about 2.8 or less, and still more preferably about 2.6 or less. The low-k film is typically produced by coating or plasma CVD.

Specific examples thereof include, but are not limited to: inorganic SOG films (HSG: hydrogenated silsesquioxane), organic SOG films (MSQ film: methyl silsesquioxane film) or coating films referred to as organic polymer films principally composed of a polyallyl ether or the like such as LKD series (trade name; JSR Corporation), HSG series (trade name; Hitachi Chemical Co., Ltd.), Nanoglass (trade name; Honeywell), IPS (trade name; Catalysts and Chemicals Ind., Co., Ltd.), $Z_3M$ (trade name; Dow Corning), XLK (trade name;

Dow Corning), FOx (trade name; Dow Corning), Orion (trade name; Tricon), NCS (trade name; Catalysts and Chemicals Ind., Co., Ltd.), and SiLK, porous-SiLK (trade name; Dow Corning); plasma CVD films typified by Black Diamond (trade name; Applied Materials), Coral (trade name; Novellus), and Aurora (trade name; ASM).

Examples of resists include, but are not limited to, KrF (Krypton F), ArF, $F_2$ resists, and the like.

The filling material is usually an organic compound that also functions as an anti-reflection film.

II. Removal of Cu Oxide and/or Residues After a Dry Process

The method for removing residues of the present invention is a method for removing residues present on semiconductor substrates after a dry process (dry etching and/or ashing), mainly in the formation processes of damascene, dual damascene, and like structures, as well as capacitor structures. Specifically, the method removes the residues present on semiconductor substrates having a Cu/low-k multilayer interconnect structure after a dry process, using the above-described residue-removing solution.

The present invention also provides a method for manufacturing semiconductor devices. The method includes the steps of (1) subjecting a semiconductor substrate having Cu as an interconnect material, and a low dielectric constant film (a low-k film) as an interlayer dielectric material, to dry etching and/or ashing; and (2) bringing the semiconductor substrate processed in Step (1) into contact with the residue-removing solution.

After a low-k film is formed on a substrate, an insulating film barrier such as an SiN, SiC, TaN, or like film may be formed, as needed, on the low-k film, and etched together with the low-k film.

The process of removing residues is performed by bringing target semiconductor substrates into contact with the residue-removing solution. The method for bringing the substrates into contact with the residue-removing solution can be suitably determined according to the type or temperature of the residue-removing solution without being particularly limited, insofar as Cu oxide and/or residues after a dry process can be removed, Cu corrosion is suppressed, and substantially no damage is caused to the low-k film. Various contact methods can be used; for example, a batch method wherein a large number of targets (wafers) housed in cassettes are immersed in a tank containing the chemical solution; a single-wafer method wherein cleaning is performed by applying the chemical solution onto the targets (wafers) being rotated; and a spraying method wherein cleaning is performed by continuously spraying the chemical solution toward the targets (wafers).

The temperature of the residue-removing solution is, for example, about 10 to 60° C., preferably about 15 to 40° C. The contact time is not limited, and may be suitably selected; for example, the contact time is about 0.5 to 60 minutes, preferably about 1 to 40 minutes.

In the batch method, wafers may be immersed, as required, in the residue-removing solution being stirred. The stirring speed is not limited, and may be suitably selected. When unwanted substances are difficult to remove, the targets may be immersed in the residue-removing solution and subjected to, for example, ultrasonic cleaning.

The method for removing Cu oxide of the present invention may further include cleaning, with pure water, the wafers from which Cu oxide and/or residues after a dry process have been removed. This cleaning step rinses off the Cu surface-protective agent-containing residue-removing solution of the present invention.

Semiconductor substrates from which Cu oxide and/or residues after a dry process have been removed using the Cu surface-protective agent-containing residue-removing solution of the present invention can be processed into various types of semiconductor devices, using known processes such as, for example, the formation of Cu interconnects (for example, the process described in *Details of Semiconductor CMP Technology;* written and edited by Toshiro DOI, 2001).

Note that the Cu surface-protective agent attached to the Cu surface can be desorbed from a semiconductor substrate by heating the substrate at a temperature of 180° C. or higher (preferably about 200 to 300° C.) under an inert gas or vacuum atmosphere during a process such as spattering after cleaning or a desorption process that is newly added.

EXAMPLES

Examples are given below to clarify the features of the present invention. The invention, however, is by no means limited to these Examples.

In order to examine the degrees of Cu oxidation, Cu cracking, and Cu surface roughness after treatment with the residue-removing solution that contains a Cu surface-protective agent and that is used for removing residues after a dry process, wafers having test patterns with a Cu/low-k dual damascene structure formed by a via-first process were used. The low-k film of the Cu/low-k dual damascene structure was an SiOC film formed by plasma CVD, and the insulating film barrier was an SiN film. Residues after a dry process were present in large amounts at the bottoms of via holes, and observed in small amounts on the side walls of the via holes and on the surface of the low-k substrate. In these samples, the Cu surfaces had been damaged during a dry process, and thus cracking or surface roughness would easily occur when treated with a chemical solution.

The process of removing residues after a dry process was performed as follows. The wafers with test patterns were immersed at 25° C. in the chemical solutions shown in the Examples and Comparative Examples, while being stirred (at about 600 rpm) for 1 to 3 minutes. The immersed wafers were then rinsed under running ultrapure water, and dried.

After the residue-removal process, 12 via holes were examined with an electron microscope (SEM) for their cross-sectional shape and the state of the removal of the residues after a dry process. Moreover, in order to determine the presence or absence of cracks on the Cu surface, and the state of the Cu surface roughness, 60 via holes were examined under an electron microscope (SEM). Where necessary, a cross-section of the via holes was examined under an SEM.

When a thin film that was formed as a result of damage during a dry process was present on the Cu surface, portions where Cu was exposed were magnified up to 100,000 times by an electron microscope, and the state thereof and the presence or absence of cracks were examined.

Furthermore, in order to examine damage to the Cu and low-k films, which is difficult to detect in evaluations using the wafers with test patterns, blanket wafers having Cu and low-k films thereon were immersed in the chemical solutions of the Examples and Comparative Examples for 10 minutes, after which the etching rates were determined. In order to examine changes in their surface conditions, the low-k films were measured for their contact angles before and after immersion in the chemical solutions, and the contact angles were compared. A correlation has been found, according to thermal desorption spectroscopy (TDS), in that the greater the change in contact angle, the greater the amount of water adsorption. That is to say, the change in contact angle reflects the change in the outermost surface of the low-k film. The contact angle was measured using a contact angle meter.

Additionally, the Cu blanket wafers immersed in the chemical solutions were maintained in air (25° C., 40% RH), and the state of the Cu oxidation was determined. The rates of the growth of Cu oxide films were examined by observing Cu peaks originating from CuO using XPS (X-ray photoelectron spectroscopy), and comparing the results.

The fluorine-containing compound and Cu surface-protective agents 1 to 3 used in the chemical solutions of the Examples and Comparative Examples are the following compounds.

Fluorine-containing compound: $NH_4F$

Cu surface-protective agent 1: indazole (from Acros Organics)

Cu surface-protective agent 2: 2-mercaptobenzothiazole (from Acros Organics)

Cu surface-protective agent 3: 2,4,6-triaminopyrimidine (from Acros Organics)

Tables 2 to 5 show the Examples, and Tables 6 and 7 show the Comparative Examples. Table 1 presents the determination criteria for the test results.

TABLE 1

| | | Evaluations Using the Patterned Wafers | | | | | |
|---|---|---|---|---|---|---|---|
| | | Residue-Removing Performance | | Evaluation of Via Hole Pattern Shapes | | | |
| | | Via Holes | | (Immersion Time in the Chemical Solutions: 3 min) | | | |
| Criteria | | Cu Surface | Side Walls | Substrate Surface | Cu Surface Thin Film | Cu Surface Roughness Surface Condition | Side Walls | Cu Surface Cracking (*) |
| | | Residue Removal Time | | | | | | |
| Determination | Best | A: 1 min or less | | | A: no damage | A: no erosion | | A: no cracks |
| | Good | B: 1-2 min | | | B: minute damage | B: no erosion problems | | B: 3 or less shallow cracks |
| | Partly Defective | C: 2-3 min | | | C: Half- or less than half-damaged | C: a low degree of surface roughness | | C: 5 or less normal cracks |
| | Defective | D: 3 min or more | | | D: Half- or more than half-damaged | D: erosion | | D: 5 or more deep cracks |

| | | Evaluations Using the Blanket Films | | | |
|---|---|---|---|---|---|
| | | Cu | | Low-k Film (SiOC Film) | |
| | | Oxidation | | | |
| Criteria | | XPS Time Until Cu Peak of CuO is Produced | Corrosion Etching Etching Rate | | Surface Layer Degradation Change in Contact Angle |
| Determination | Best | A: 1 week or more | A: 1 Å/min or less | | A: 1° or less |
| | Good | B: 1 week or less | B: 1-2 Å/min | | B: 1-3° |
| | Partly Defective | C: 3 days or less | C: 2-3 Å/min | | C: 3-5° |
| | Defective | D: 24 hours or less | D: 3 Å/min or more | | D: 5° or more |

(*) The term "shallow cracks" denotes cracks with a width and depth of less than about 10 nm; the term "deep cracks" denotes cracks with a width and a depth of more than about 20 nm; and the term "normal cracks" denotes cracks with a width and a depth of from about 10 to about 20 nm.

Examples 1 to 29

The chemical solutions used in Examples 1 to 29 were prepared in accordance with the compositions and proportions listed in Table 2. The pHs were adjusted as shown in Table 2. Table 3 shows the results of the tests using the chemical solutions of Examples 1 to 27.

TABLE 2

Composition of Residue-Removing Solution

| Ex. | Water wt % | Monocarboxylic acid and/or Polycarboxylic acid | Acid wt % | Base | Base wt % | Salt wt % | NH₄F Wt % | Neutral organic compound | Wt % | Cu surface-protective agent (ppm) 1 | 2 | 3 | pH |
|---|---|---|---|---|---|---|---|---|---|---|---|---|---|
| 1 | 97.5 | Acetic acid | 0.92 | Ethylamine | 0.93 | 1.85 | — | | | | | | 9.1 |
| 2 | 97.3 | Trifluoroacetic acid | 1.92 | Ethylamine | 0.79 | 2.71 | — | | | | | | 6.9 |
| 3 | 96.3 | Glutaric acid | 2.20 | Ethylamine | 1.47 | 3.67 | — | | | | | | 7.0 |
| 4 | 97.6 | Acetic acid | 1.02 | Piperidine | 1.44 | 2.46 | — | | | | | | 7.0 |
| 5 | 98.2 | Acetic acid | 0.92 | Ethylamine | 0.68 | 1.60 | — | | | | | | 6.9 |
| 6 | 96.5 | Succinic acid | 1.97 | Ethylamine | 1.49 | 3.46 | — | | | | | | 6.9 |
| 7 | 97.5 | Acetic acid | 1.00 | Morpholine | 1.44 | 2.44 | — | | | | | | 6.9 |
| 8 | 98.0 | Acetic acid | 1.03 | Ethanolamine | 1.04 | 2.07 | — | | | | | | 6.9 |
| 9 | 91.4 | Acetic acid | 5.87 | Triethanolamine | 2.68 | 8.55 | — | | | | | | 4.0 |
| 10 | 97.2 | Acetic acid | 1.01 | Diethanolamine | 1.78 | 2.79 | — | | | | | | 7.0 |
| 11 | 98.3 | Acetic acid | 1.70 | Triethanolamine | 2.80 | 4.51 | — | | | | | | 5.0 |
| 12 | 96.5 | Acetic acid | 1.01 | Triethanolamine | 2.81 | 3.83 | — | | | | | | 7.0 |
| 13 | 97.7 | Acetic acid | 1.60 | Ethylamine | 0.68 | 2.28 | — | | | | | | 5.0 |
| 14 | 98.1 | Glutaric acid | 1.10 | Ethylamine | 0.68 | 1.78 | — | | | | | | 7.0 |
|    | 98.2 | Acetic acid | 0.46 | Ethylamine | 0.34 | 0.80 | — | | | | | | |
| 15 | 96.5 | Succinic acid | 1.97 | Ethylamine | 1.49 | 3.46 | 0.05 | — | | | | | 6.9 |
| 16 | 96.2 | Glutaric acid | 2.20 | Ethylamine | 1.47 | 3.67 | 0.1 | — | | | | | 7.0 |
| 17 | 98.1 | Acetic acid | 0.92 | Ethylamine | 0.68 | 1.60 | 0.15 | — | | | | | 6.9 |
| 18 | 97.1 | Trifluoroacetic acid | 1.92 | Ethylamine | 0.79 | 2.71 | 0.2 | — | | | | | 6.9 |
| 19 | 97.7 | Acetic acid | 1.03 | Ethanolamine | 1.04 | 2.07 | 0.25 | — | | | | | 6.9 |
| 20 | 96.5 | Succinic acid | 1.97 | Ethylamine | 1.49 | 3.46 | 0 | — | | 1 | 0 | 0 | 6.9 |
| 21 | 96.2 | Glutaric acid | 2.20 | Ethylamine | 1.47 | 3.67 | 0.1 | — | | 0 | 1 | 0 | 7.0 |
| 22 | 98.2 | Acetic acid | 0.92 | Ethylamine | 0.68 | 1.60 | 0 | — | | 0.5 | 0 | 100 | 6.9 |
| 23 | 97.2 | Trifluoroacetic acid | 1.92 | Ethylamine | 0.79 | 2.71 | 0.1 | — | | 0 | 1 | 100 | 6.9 |
| 24 | 98.0 | Acetic acid | 1.03 | Ethanolamine | 1.04 | 2.07 | 0 | — | | 0 | 0 | 100 | 6.9 |
| 25 | 96.4 | Succinic acid | 1.97 | Ethylamine | 1.49 | 3.46 | 0.1 | Diethylene glycol monoethyl ether acetate | 50 | | 0.5 | 100 | 6.9 |
| 26 | 96.3 | Glutaric acid | 2.20 | Ethylamine | 1.47 | 3.67 | 0 | Diethylene glycol | 40 | 1000 | | | 7.0 |
| 27 | 98.1 | Acetic acid | 0.92 | Ethylamine | 0.68 | 1.60 | 0.1 | Triethylene glycol dimethyl ether | 30 | 100 | | | 6.9 |
| 28 | 97.3 | Trifluoroacetic acid | 1.92 | Ethylamine | 0.79 | 2.71 | 0 | Triethylene glycol monomethyl ether | 20 | 50 | | | 6.9 |
| 29 | 97.9 | Acetic acid | 1.03 | Ethanolamine | 1.04 | 2.07 | 0.1 | Ethylene glycol diacetate | 10 | 10 | | | 6.9 |

TABLE 3

| | Evaluations Using the Patterned Wafers | | | | | | | | | | Evaluations Using the Blanket Films Low-k Film (SiOC Film) |
|---|---|---|---|---|---|---|---|---|---|---|---|
| | Residue-Removing Performance | | | Evaluation of Via Hole Pattern Shapes (Immersion Time in the Chemical Solutions: 3 min) | | | | Cu | | | Surface Layer Degradation |
| Ex. | Cu Surface on Via Hole Bottom | Via Hole Side Walls | Substrate Surface | Cu Surface Thin Layer | Cu Surface Roughness | Cu Surface Cracking | Side Walls | Oxidation XPS | Corrosion | Etching Etching Rate | Change in Contact Angle |
| 1 | B | B | B | A | A | A | A | D | A | A | A |
| 2 | A | A | A | A | A | A | A | D | A | A | A |
| 3 | A | A | A | A | A | A | A | D | A | A | A |
| 4 | A | A | A | A | A | A | A | D | A | A | A |
| 5 | A | A | A | A | A | A | A | D | A | A | A |
| 6 | A | A | A | A | A | A | A | D | A | A | A |
| 7 | A | A | A | A | A | A | A | D | A | A | A |
| 8 | A | A | A | A | A | A | A | D | A | A | A |
| 9 | A | A | A | A | A | A | B | D | B | A | A |
| 10 | A | A | A | A | A | A | A | D | B | A | A |
| 11 | A | A | A | A | A | A | B | D | B | A | A |
| 12 | A | A | A | A | A | A | A | D | B | A | A |
| 13 | A | A | A | A | A | A | B | D | B | A | A |
| 14 | A | A | A | A | A | A | A | D | A | A | A |
| 15 | A | A | A | A | A | A | A | D | A | A | A |
| 16 | A | A | A | A | A | A | A | D | A | A | A |

TABLE 3-continued

| | Evaluations Using the Patterned Wafers | | | | | | | | | | Evaluations Using the Blanket Films | | |
|---|---|---|---|---|---|---|---|---|---|---|---|---|---|
| | Residue-Removing Performance | | | Evaluation of Via Hole Pattern Shapes (Immersion Time in the Chemical Solutions: 3 min) | | | | Cu | | | Low-k Film (SiOC Film) | | |
| | Cu Surface | | | | | | | | | | Surface Layer Degradation | | |
| Ex. | on Via Hole Bottom | Via Hole Side Walls | Substrate Surface | Cu Surface Thin Layer | Cu Surface Roughness | Cu Surface Cracking | Side Walls | Oxidation XPS | Corrosion Etching Rate | Etching | Change in Contact Angle |
|---|---|---|---|---|---|---|---|---|---|---|---|
| 17 | A | A | A | A | A | A | A | D | A | A | A |
| 18 | A | A | A | A | A | A | A | D | A | B | A |
| 19 | A | A | A | A | A | A | A | D | A | B | A |
| 20 | A | A | A | A | A | A | A | A | A | A | A |
| 21 | A | A | A | A | A | A | A | A | A | A | A |
| 22 | A | A | A | A | A | A | A | A | A | A | A |
| 23 | A | A | A | A | A | A | A | A | A | A | A |
| 24 | A | A | A | A | A | A | A | B | A | A | A |
| 25 | A | A | A | B | A | A | A | A | A | A | A |
| 26 | A | A | A | B | A | A | A | A | A | A | A |
| 27 | A | A | A | A | A | A | A | A | A | A | A |
| 28 | A | A | A | A | A | A | A | A | A | A | A |
| 29 | A | A | A | B | A | A | A | A | A | A | A |

Examples 30 to 44

The chemical solutions of Examples 30 to 44 were prepared in accordance with the compositions and proportions listed in Table 4. The pHs were adjusted as shown in Table 4. Table 5 shows the results of the tests using the chemical solutions of Examples 30 to 44.

TABLE 4

| | Composition of Residue-Removing Solution | | | | | | | | | | | | | |
|---|---|---|---|---|---|---|---|---|---|---|---|---|---|---|
| | Water | | Acid | Composition of polycarboxylic acid salt | | | | | NH$_4$F | Neutral organic | | Cu surface-protective agent (ppm) | | |
| Ex. | wt % | Acid | wt % | Polycarboxylic acid | Acid wt % | Base | Base wt % | Salt wt % | wt % | compound | Wt % | 1 | 2 | 3 | pH |
| 30 | 94.4 | Succinic acid | 1.25 | Succinic acid | 1.71 | Triethanol-amine | 4.36 | 6.07 | 0 | | | | | | 5.0 |
| 31 | 97.6 | Succinic acid | 1.05 | Succinic acid | 1.71 | Ethylamine | 1.31 | 3.02 | 0 | — | | | | | 5.0 |
| 32 | 99.1 | | | Glutaric acid | 1.92 | Ethylamine | 0.89 | 2.81 | 0 | — | | | | | 5.0 |
| 33 | 99.2 | | | Succinic acid | 1.71 | Ethylamine | 0.82 | 2.53 | 0 | — | | | | | 5.0 |
| 34 | 97.7 | Acetic acid | 0.95 | Glutaric acid | 2.02 | Ethylamine | 1.4 | 3.38 | 0 | — | | | | | 5.0 |
| 35 | 98.3 | Succinic acid | 1.25 | Succinic acid | 1.71 | Ammonia | 0.47 | 2.18 | 0 | | 0 | 1 | 0 | 0 | 5.0 |
| 36 | 96.3 | Succinic acid | 1.05 | Succinic acid | 1.71 | Tetramethyl-ammonium hydroxide | 2.62 | 4.33 | 0 | — | 0 | 0 | 1 | 0 | 5.0 |
| 37 | 99.1 | | | Glutaric acid | 1.92 | Ethylamine | 0.89 | 2.81 | 0.01 | — | 0 | 0.5 | 0 | 100 | 5.0 |
| 38 | 99.1 | | | Succinic acid | 1.71 | Ethylamine | 0.82 | 2.53 | 0.05 | — | 0 | 0 | 1 | 100 | 5.0 |
| 39 | 98.5 | Acetic acid | 0.95 | Glutaric acid | 2.0 | Ammonia | 0.5 | 2.50 | 0.1 | — | 0 | 0 | 0 | 100 | 5.0 |
| 40 | 98.3 | Succinic acid | 1.25 | Succinic acid | 1.71 | Ammonia | 0.47 | 2.18 | 0 | Diethylene glycol monoethyl ether acetate | 50 | 0 | 0.5 | 100 | 5.0 |
| 41 | 96.3 | Succinic acid | 1.05 | Succinic acid | 1.71 | Tetramethyl-ammonium hydroxide | 2.62 | 4.33 | 0 | Diethylene glycol | 40 | 1000 | 0 | 0 | 5.0 |
| 42 | 99.0 | | | Glutaric acid | 1.92 | Ethylamine | 0.89 | 2.81 | 0.1 | Triethylene glycol dimethyl ether | 30 | 100 | 0 | 0 | 5.0 |
| 43 | 99.1 | | | Succinic acid | 1.71 | Ethylamine | 0.82 | 2.53 | 0.05 | Triethylene glycol monomethyl ether | 20 | 50 | 0 | 0 | 5.0 |
| 44 | 98.6 | Acetic acid | 0.95 | Glutaric acid | 2.0 | Ammonia | 0.5 | 2.50 | 0.01 | Ethylene glycol diacetate | 10 | 10 | 0 | 0 | 5.0 |

TABLE 5

| | Evaluations Using the Patterned Wafers | | | | | | | Evaluations Using the Blanket Films | | | |
|---|---|---|---|---|---|---|---|---|---|---|---|
| | Residue-Removing Performance | | | Evaluation of Via Hole Pattern Shapes (Immersion Time in the Chemical Solutions: 3 min) | | | | Cu | | | Low-k Film (SiOC Film) Surface Layer Degradation |
| | Cu Surface | | | | | | | | | | |
| Ex. | on Via Hole Bottom | Via Hole Side Walls | Substrate Surface | Cu Surface Thin Layer | Cu Surface Roughness | Cu Surface Cracking | Side Walls | Oxidation XPS | Corrosion Etching | Etching Rate | Change in Contact Angle |
| 30 | A | A | A | B | A | A | A | C | B | A | A |
| 31 | A | A | A | A | A | A | A | C | B | A | A |
| 32 | A | A | A | A | A | A | A | C | A | A | A |
| 33 | A | A | A | A | A | A | A | C | A | A | A |
| 34 | A | A | A | A | A | A | A | C | A | A | A |
| 35 | A | A | A | B | A | A | A | A | A | A | A |
| 36 | A | A | A | B | A | A | A | A | A | B | A |
| 37 | A | A | A | A | A | A | A | A | B | B | A |
| 38 | A | A | A | A | A | A | A | A | A | A | A |
| 39 | A | A | A | A | A | A | A | A | A | B | A |
| 40 | A | A | A | B | A | A | A | A | B | A | A |
| 41 | A | A | A | B | A | A | A | A | A | A | A |
| 42 | A | A | A | A | A | A | A | A | A | B | A |
| 43 | A | A | A | A | A | A | A | A | A | B | A |
| 44 | A | A | A | B | A | A | A | A | A | A | A |

The results of the evaluations using the wafers with test patterns shown in Tables 2 to 5 show that the residue-removing solutions of Examples 1 to 44 exhibit excellent residue-removing performance. These solutions caused neither a change in the pattern shapes, nor Cu surface roughness or minute cracking of the Cu surfaces, and were also capable of preventing Cu oxidation.

The results of the evaluations using the blanket wafers show that the residue-removing solutions cause neither Cu corrosion nor damage to low-k films, because the etching rates for Cu and low-k films were low, and the contact angles of the low-k films also did not change.

In Examples 15 to 29 and 37 to 44, $NH_4F$ was added as a fluorine-containing compound. When silicon-containing residues are present in large amounts, the addition of $NH_4F$ increases the residue-removing effect. In Examples 25 to 29, and 40 to 44, a neutral organic compound was further added. It is effective to remove residues containing organic substances. In Examples 20 to 29, and 35 to 44, a Cu surface-protective agent was added, allowing the chemical solutions thereof to exert an antioxidant effect on the Cu surfaces. Further, in Example 20, similar effects were attained when indazole-3-carboxylic acid was used instead of indazole.

In Examples 3, 5, and 20, similar effects were attained when methylamine was used instead of ethylamine. In Examples 26, 27, 41, and 42, similar effects were attained when 5-nitroindazole was used instead of indazole.

In Example 9, a residue-removing solution comprising acetic acid, which is a Brønsted acid whose pKa is at least 3 at 25° C.; triethanolamine acetate, which is an amine salt of a monocarboxylic acid; and water, was used. This residue-removing solution was prepared in such a manner that the starting materials, i.e., acetic acid and triethanolamine, were separately dissolved in water. In the above case, an effect similar to that attained in the case where an amine salt of a monocarboxylic acid was added was also attained.

In Examples 32, 33, 37, 38, 42, and 43, each residue-removing solution was prepared by separately dissolving, in water, succinic acid or glutaric acid, which are Brønsted acids having a pKa of 3 or more at 25° C., and which are polycarboxylic acids that form a 7- or more-membered ring chelate with copper; and ethylamine, which forms a salt with a polycarboxylic acid. In these Examples, an effect similar to that attained in the case where an amine salt of a monocarboxylic acid was added was also attained.

Comparative Examples 1 to 19

In Comparative Examples 1 to 19, chemical solutions were prepared in accordance with the compositions and proportions listed in Table 6. The pHs were adjusted as shown in Table 6. Table 7 shows the results of the tests using the chemical solutions of Comparative Examples 1 to 19.

TABLE 6

| | | | Composition of Residue-Removing Solution | | | | | |
|---|---|---|---|---|---|---|---|---|
| | | | | Composition of monocarboxylic acid salt and/or polycarboxylic acid salt | | | | |
| Comp. Ex. | Water wt % | Monocarboxylic acid and/or polycarboxylic acid, and a salt thereof | Wt % | Monocarboxylic acid and/or polycarboxylic acid | Acid wt % | Base | Base wt % | Salt wt % | pH |
| 1 | 99.0 | Acetic acid | 1.0 | | | | | | 3.0 |
| 2 | 98.5 | Oxalic acid | 1.5 | | | | | | 1.8 |
| 3 | 98.3 | Malonic acid | 1.7 | | | | | | 1.0 |
| 4 | 98.7 | Ammonium acetate | 1.3 | | | | | | 7.0 |
| 5 | | | | Acetic acid | | Tetramethylammonium hydroxide | | 3.74 | 7.0 |

TABLE 6-continued

Composition of Residue-Removing Solution

| Comp. Ex. | Water wt % | Monocarboxylic acid and/or polycarboxylic acid, and a salt thereof | Wt % | Monocarboxylic acid and/or polycarboxylic acid | Acid wt % | Base | Base wt % | Salt wt % | pH |
|---|---|---|---|---|---|---|---|---|---|
| 6 | 97.9 | Ammonium oxalate | 2.1 | | | | | | 7.0 |
| 7 | 97.7 | | | Malonic acid | | Ammonia | | 2.30 | 7.0 |
| 8 | 95.9 | Ammonium citrate tribasic | 4.1 | | | | | | 7.0 |
| 9 | 98.5 | Acetic acid | 0.5 | Malonic acid | 1.5 | Ammonia | 0.5 | 2.00 | 5.0 |
| 10 | 98.2 | Oxalic acid | 0.8 | Malonic acid | 1.5 | Ammonia | 0.5 | 2.00 | 5.0 |
| 11 | 97.0 | Trifluoroacetic acid | 1.0 | Malonic acid | 1.5 | Ammonia | 1.5 | 2.00 | 5.0 |
| 12 | 93.8 | Trifluoroacetic acid | 1.0 | Succinic acid | 1.71 | Tetramethylammonium hydroxide | 2.6 | 4.31 | 5.0 |
| 13 | 93.8 | Levulinic acid | 1.0 | Succinic acid | 1.71 | Tetramethylammonium hydroxide | 2.6 | 4.31 | 5.0 |
| 14 | 92.2 | | | Acetic acid | 4.02 | Triethylenetetramine | 3.76 | 7.78 | 6.9 |
| 15 | 97.4 | | | Lactic acid | 1.86 | Ethylamine | 0.70 | 2.56 | 6.8 |
| 16 | 95.9 | | | Tartaric acid | 2.57 | Ethylamine | 1.55 | 4.12 | 7.0 |
| 17 | 94.5 | | | Acetic acid | 2.96 | Diethylenetriamine | 2.51 | 5.47 | 7.0 |
| 18 | 96.7 | | | Acetic acid | 2.09 | Ethylenediamine | 1.17 | 3.26 | 7.0 |
| 19 | 97.4 | | | Malonic acid | 1.285 | Ethylamine | 1.108 | 2.39 | 7.1 |

TABLE 7

| | Evaluations Using the Patterned Wafers | | | | | | | | | Evaluations Using the Blanket Films Low-k Film (SiOC Film) |
|---|---|---|---|---|---|---|---|---|---|---|---|
| | Residue-Removing Performance | | | Evaluation of Via Hole Pattern Shapes (Immersion Time in the Chemical Solutions: 3 min) | | | | Cu | | | Surface Layer Degradation |
| | Cu Surface | | | | | | | | | | |
| Comp. Ex. | on Via Hole Bottom | Via Hole Side Walls | Substrate Surface | Cu Surface Thin Layer | Cu Surface Roughness | Cu Surface Cracking | Side Walls | Oxidation XPS | Corrosion Etching | Etching Rate | Change in Contact Angle |
| 1 | A | A | B | D | A | D | B | C | C | A | C |
| 2 | A | A | B | D | A | D | B | C | B | A | C |
| 3 | A | A | B | D | A | D | B | D | B | A | C |
| 4 | A | A | B | C | C | C | A | D | D | A | A |
| 5 | B | B | B | C | C | C | A | D | C | A | A |
| 6 | B | B | B | C | C | C | A | D | C | A | A |
| 7 | A | B | B | C | C | C | A | D | D | A | A |
| 8 | B | B | B | C | C | C | A | D | D | A | A |
| 9 | A | B | B | C | A | C | A | C | A | A | B |
| 10 | A | B | B | C | A | C | A | C | A | A | A |
| 11 | A | A | A | D | C | B | A | C | A | A | A |
| 12 | A | A | A | D | C | B | A | C | A | A | A |
| 13 | A | A | A | C | C | B | A | C | A | A | A |
| 14 | A | B | B | C | C | C | A | D | D | A | A |
| 15 | A | B | B | C | C | C | A | D | D | A | A |
| 16 | A | B | B | C | C | C | A | D | D | A | A |
| 17 | A | B | B | C | C | C | A | D | D | A | A |
| 18 | A | B | B | C | C | C | A | D | D | A | A |
| 19 | A | B | B | C | C | C | A | D | D | A | A |

In all of Comparative Examples 1 to 19, the thin films were not left on the Cu surfaces without damage. Due to the low pHs, the chemical solutions of Comparative Examples 1 to 3 easily caused cracking on the Cu surfaces, as well as degradation of the surface layers of the low-k films.

In Comparative Examples 4 to 8, aqueous solutions each comprising tetramethylammonium hydroxide or an ammonium salt of a carboxylic acid were used. However, due to the pH of 7, the aqueous solutions of these salts caused Cu corrosion, Cu surface roughness, and Cu cracking. Ammonium salts and tetramethylammonium hydroxides had no Cu corrosion-prevention effect.

In Comparative Examples 9 to 11, chemical solutions comprising a combination of a malonate ammonium salt that has a chelating effect, and that forms a 6-membered ring with Cu; and acetic acid, which is a weak acid, oxalic acid, which forms a 5-membered ring with a strong chelating effect, or trifluoroacetic acid, which is a strong acid, were used. The chemical solutions comprising the above-mentioned combinations failed to prevent cracks from occurring on the Cu surfaces, and showed low Cu surface-protection effects. Although Patent Literature 5 teaches that a chemical solution comprising a combination of a trifluoroacetic acid and a malonic acid exerts high Cu surface-protection effects, surface roughness was not sufficiently prevented from occurring on the test samples.

Chemical solutions of Comparative Examples 12 and 13 are those that are disclosed in Patent Literatures 5 and 6, respectively. However, these solutions also failed to sufficiently prevent surface roughness from occurring on the test samples.

It is presumed that trifluoroacetic acid, which is a strong acid, and malonic acid, which forms a 6-membered ring chelate, act on Cu too strongly.

In Comparative Examples 14, 17, and 18, chemical solutions each comprising a salt of a carboxylic acid and a diamine were used. In Comparative Examples 13 and 14, chemical solutions each comprising a salt of an oxycarboxylic acid and an amine were used. In Comparative Example 19, a chemical solution comprising a salt of amine, and malonic acid that has a chelating effect and that forms a 6-membered ring with Cu was used. All of these chemical solutions caused Cu corrosion, Cu surface roughness, and Cu cracking. Diamines, oxycarboxylic acids, and carboxylic acids such as malonic acids that have a chelating effect, and that form a 6-membered ring with Cu, have a tendency to cause Cu corrosion.

Industrial Applicability

The residue-removing solution of the present invention is effective as a solution for removing residues after a semiconductor dry process.

The invention claimed is:

1. A residue-removing solution for removing residues after a dry process, comprising an amine salt of a monocarboxylic acid and/or a salt of a polycarboxylic acid that forms a 7- or more-membered ring chelate with copper, and water, the residue-removing solution being (A) or (B) described below:

(A) an aqueous solution consisting of
(1) a Brønsted acid whose pKa is at least 4.56 at 25° C.,
(2) an amine salt of a monocarboxylic acid, and/or (3) at least one member selected from the group consisting of an ammonium salt, an amine salt, and a quaternary ammonium salt of an aliphatic dicarboxylic acid that forms a 7- or more-membered ring chelate with copper, and
(4) water,
wherein the pH of the aqueous solution is equal to or less than the pKa of the monocarboxylic acid at 25° C.; is equal to or less than the $pKa_2$ of the aliphatic dicarboxylic acid at 25° C.; or is equal to or less than the pKa of the monocarboxylic acid at 25° C. or $pKa_2$ of the aliphatic dicarboxylic acid at 25° C., whichever is greater, when (2) and (3) coexist,
the pH of the aqueous solution (A) is 4 to 6, and
the Brønsted acid is a monocarboxylic acid and/or a polycarboxylic acid;

(B) an aqueous solution consisting of
(5) an amine salt of a $C_1$-$C_8$ monocarboxylic acid, and/or
(6) an amine salt of an aliphatic dicarboxylic acid that forms a 7- or more-membered ring chelate with copper, and
(7) water,
wherein the pH of the aqueous solution is equal to or greater than the pKa of the $C_1$-$C_8$ monocarboxylic acid at 25° C.; is equal to or greater than the $pKa_2$ of the aliphatic dicarboxylic acid at 25° C.; or is equal to or greater than the pKa of the $C_1$-$C_8$ monocarboxylic acid at 25° C. or $pKa_2$ of the aliphatic dicarboxylic acid at 25° C., whichever is greater, when (5) and (6) coexist, and
the pH of the aqueous solution (B) is 8 or less.

2. The residue-removing solution according to claim 1, being (B) above.

3. The residue-removing solution according to claim 2, wherein the $C_1$-$C_8$ monocarboxylic acid in (5) is acetic acid or propionic acid, and the aliphatic dicarboxylic acid in (6) that forms a 7- or more-membered ring chelate with copper is succinic acid, glutaric acid, or adipic acid.

4. The residue-removing solution according to claim 2, wherein the amine salt in (5) and the amine salt in (6) are each a salt of methylamine, ethylamine, butylamine, piperidine, morpholine, ethanolamine, diethanolamine, or triethanolamine.

5. The residue-removing solution according to claim 2, wherein the pH is 6 to 8.

6. The residue-removing solution according to claim 2, comprising 0.05 to 30 wt % of the amine salt of the $C_1$-$C_8$ monocarboxylic acid in (5) and/or the amine salt of the aliphatic dicarboxylic acid in (6) that forms a 7- or more-membered ring chelate with copper.

7. The residue-removing solution according to claim 1, being (A) above.

8. The residue-removing solution according to claim 7, wherein the Brønsted acid (1) whose pKa is at least 4.56 at 25° C. is monocarboxylic acid, or aliphatic dicarboxylic acid.

9. The residue-removing solution according to claim 8, wherein the monocarboxylic acid is acetic acid or propionic acid, and the aliphatic dicarboxylic acid is succinic acid, glutaric acid, or adipic acid.

10. The residue-removing solution according to claim 7, wherein the monocarboxylic acid in (2) is acetic acid or propionic acid, and the aliphatic dicarboxylic acid in (3) that forms a 7- or more-membered ring chelate with copper is succinic acid, glutaric acid or adipic acid.

11. The residue-removing solution according to claim 7, wherein the amine salt in (2) and the amine salt in (3) are each a salt of methylamine, ethylamine, butylamine, piperidine, morpholine, ethanolamine, diethanolamine, or triethanolamine, and the quaternary ammonium salt in (3) is a tetramethylammonium salt.

12. The residue-removing solution according to claim 7, comprising 0.05 to 30 wt % of the Brønsted acid (1) whose pKa is at least 4.56 at 25° C., and 0.05 to 30 wt % of the amine salt (2) of the monocarboxylic acid and/or at least one member (3) selected from the group consisting of an ammonium salt, an amine salt, and a quaternary ammonium salt of the aliphatic dicarboxylic acid that forms a 7- or more-membered ring chelate with copper.

13. A method for removing residues present on semiconductor substrates after dry etching and/or ashing,
the method comprising bringing a semiconductor substrate after dry etching and/or ashing into contact with the residue-removing solution of claim 1.

14. The method according to claim 13, wherein the semiconductor substrate has Cu as an interconnect material, and a low dielectric constant film (a low-k film) as an interlayer dielectric material.

15. A method for manufacturing semiconductor devices comprising the steps of
(a) subjecting a semiconductor substrate having Cu as an interconnect material, and a low dielectric constant film (a low-k film) as an interlayer dielectric material, to dry etching and/or ashing; and
(b) bringing the semiconductor substrate processed in Step (a) into contact with the residue-removing solution of claim 1.

16. A residue-removing solution for removing residues after a dry process, comprising an amine salt of a monocarboxylic acid and/or a salt of a polycarboxylic acid that forms a 7- or more-membered ring chelate with copper, and water,
the residue-removing solution being (A) or (B) described below:

(A) an aqueous solution consisting of
(1) a Brønsted acid whose pKa is at least 4.56 at 25° C.,
(2) an amine salt of a monocarboxylic acid, and/or (3) at least one member selected from the group consisting of an ammonium salt, an amine salt, and a quaternary ammonium salt of an aliphatic dicarboxylic acid that forms a 7- or more-membered ring chelate with copper,
(4) a fluorine-containing compound, and
(5) water,
wherein the pH of the aqueous solution is equal to or less than the pKa of the monocarboxylic acid at 25° C.; is equal to or less than the $pKa_2$ of the aliphatic dicarboxylic acid at 25° C.; or is equal to or less than the pKa of the monocarboxylic acid at 25° C. or $pKa_2$ of the aliphatic dicarboxylic acid at 25° C., whichever is greater, when (2) and (3) coexist,
the pH of the aqueous solution (A) is 4 to 6, and
the Brønsted acid is a monocarboxylic acid and/or a polycarboxylic acid;
(B) an aqueous solution consisting of
(6) an amine salt of a $C_1$-$C_8$ monocarboxylic acid, and/or
(7) an amine salt of an aliphatic dicarboxylic acid that forms a 7- or more-membered ring chelate with copper,
(8) a fluorine-containing compound, and
(9) water,
wherein the pH of the aqueous solution is equal to or greater than the pKa of the $C_1$-$C_8$ monocarboxylic acid at 25° C.; is equal to or greater than the $pKa_2$ of the aliphatic dicarboxylic acid at 25° C.; or is equal to or greater than the pKa of the $C_1$-$C_8$ monocarboxylic acid at 25° C. or $pKa_2$ of the aliphatic dicarboxylic acid at 25° C., whichever is greater, when (6) and (7) coexist, and
the pH of the aqueous solution (B) is 8 or less.

17. A residue-removing solution for removing residues after a dry process, comprising an amine salt of a monocarboxylic acid and/or a salt of a polycarboxylic acid that forms a 7- or more-membered ring chelate with copper, and water, the residue-removing solution being (A) or (B) described below:
(A) an aqueous solution consisting of
(1) a Brønsted acid whose pKa is at least 4.56 at 25° C.,
(2) an amine salt of a monocarboxylic acid, and/or (3) at least one member selected from the group consisting of an ammonium salt, an amine salt, and a quaternary ammonium salt of an aliphatic dicarboxylic acid that forms a 7- or more-membered ring chelate with copper,
(4) a neutral organic compound, and
(5) water,
wherein the pH of the aqueous solution is equal to or less than the pKa of the monocarboxylic acid at 25° C.; is equal to or less than the $pKa_2$ of the aliphatic dicarboxylic acid at 25° C.; or is equal to or less than the pKa of the monocarboxylic acid at 25° C. or $pKa_2$ of the aliphatic dicarboxylic acid at 25° C., whichever is greater, when (2) and (3) coexist,
the pH of the aqueous solution (A) is 4 to 6, and
the Brønsted acid is a monocarboxylic acid and/or a polycarboxylic acid;
(B) an aqueous solution consisting of
(6) an amine salt of a $C_1$-$C_8$ monocarboxylic acid, and/or
(7) an amine salt of an aliphatic dicarboxylic acid that forms a 7- or more-membered ring chelate with copper,
(8) a neutral organic compound, and
(9) water,
wherein the pH of the aqueous solution is equal to or greater than the pKa of the $C_1$-$C_8$ monocarboxylic acid at 25° C.; is equal to or greater than the $pKa_2$ of the aliphatic dicarboxylic acid at 25° C.; or is equal to or greater than the pKa of the $C_1$-$C_8$ monocarboxylic acid at 25° C. or $pKa_2$ of the aliphatic dicarboxylic acid at 25° C., whichever is greater, when (6) and (7) coexist, and
the pH of the aqueous solution (B) is 8 or less.

18. A residue-removing solution for removing residues after a dry process, comprising an amine salt of a monocarboxylic acid and/or a salt of a polycarboxylic acid that forms a 7- or more-membered ring chelate with copper, and water, the residue-removing solution being (A) or (B) described below:
(A) an aqueous solution consisting of
(1) a Brønsted acid whose pKa is at least 4.56 at 25° C.,
(2) an amine salt of a monocarboxylic acid, and/or (3) at least one member selected from the group consisting of an ammonium salt, an amine salt, and a quaternary ammonium salt of an aliphatic dicarboxylic acid that forms a 7- or more-membered ring chelate with copper,
(4) a Cu surface protective agent, and
(5) water,
wherein the pH of the aqueous solution is equal to or less than the pKa of the monocarboxylic acid at 25° C.; is equal to or less than the $pKa_2$ of the aliphatic dicarboxylic acid at 25° C.; or is equal to or less than the pKa of the monocarboxylic acid at 25° C. or $pKa_2$ of the aliphatic dicarboxylic acid at 25° C., whichever is greater, when (2) and (3) coexist,
the pH of the aqueous solution (A) is 4 to 6, and
the Brønsted acid is a monocarboxylic acid and/or a polycarboxylic acid;
(B) an aqueous solution consisting of
(6) an amine salt of a $C_1$-$C_8$ monocarboxylic acid, and/or
(7) an amine salt of an aliphatic dicarboxylic acid that forms a 7- or more-membered ring chelate with copper,
(8) a Cu surface protective agent, and
(9) water,
wherein the pH of the aqueous solution is equal to or greater than the pKa of the $C_1$-$C_8$ monocarboxylic acid at 25° C.; is equal to or greater than the $pKa_2$ of the aliphatic dicarboxylic acid at 25° C.; or is equal to or greater than the pKa of the $C_1$-$C_8$ monocarboxylic acid at 25° C. or $pKa_2$ of the aliphatic dicarboxylic acid at 25° C., whichever is greater, when (6) and (7) coexist, and
the pH of the aqueous solution (B) is 8 or less,
wherein the Cu protective agent is at least one member selected from the group consisting of:
(1) a compound comprising, as a basic skeleton, a five-membered heteroaromatic compound (excluding compounds having three consecutive N atoms) having a structure represented by Formula: =N—NH—, wherein the pH of an aqueous solution of the compound (10 ppm, 23° C.) is 7 or less,
(2) a compound comprising, as a basic skeleton, a five-membered hetero compound having a structure represented by Formula: —N=C(SH)—X— (wherein X represents NH, O, or S), wherein the pH of an aqueous solution of the compound (10 ppm, 23° C.) is 7 or less, and
(3) a compound comprising, as a basic skeleton, a six-membered heteroaromatic compound having at least one nitrogen atom (N), wherein the pH of an aqueous solution of the compound (10 ppm, 23° C.) is 7 or greater.

19. A residue-removing solution for removing residues after a dry process, comprising an amine salt of a monocarboxylic acid and/or a salt of a polycarboxylic acid that forms a 7- or more-membered ring chelate with copper, and water, the residue-removing solution being (A) or (B) described below:

(A) an aqueous solution consisting of
(1) a Brønsted acid whose pKa is at least 4.56 at 25° C.,
(2) an amine salt of a monocarboxylic acid, and/or (3) at least one member selected from the group consisting of an ammonium salt, an amine salt, and a quaternary ammonium salt of an aliphatic dicarboxylic acid that forms a 7- or more-membered ring chelate with copper,
(4) a surfactant, and
(5) water,
wherein the pH of the aqueous solution is equal to or less than the pKa of the monocarboxylic acid at 25° C.; is equal to or less than the $pKa_2$ of the aliphatic dicarboxylic acid at 25° C.; or is equal to or less than the pKa of the monocarboxylic acid at 25° C. or $pKa_2$ of the aliphatic dicarboxylic acid at 25° C., whichever is greater, when (2) and (3) coexist,
the pH of the aqueous solution (A) is 4 to 6, and
the Brønsted acid is a monocarboxylic acid and/or a polycarboxylic acid;

(B) an aqueous solution consisting of
(6) an amine salt of a $C_1$-$C_8$ monocarboxylic acid, and/or
(7) an amine salt of an aliphatic dicarboxylic acid that forms a 7- or more-membered ring chelate with copper,
(8) a surfactant, and
(9) water,
wherein the pH of the aqueous solution is equal to or greater than the pKa of the $C_1$-$C_8$ monocarboxylic acid at 25° C.; is equal to or greater than the $pKa_2$ of the aliphatic dicarboxylic acid at 25° C.; or is equal to or greater than the pKa of the $C_1$-$C_8$ monocarboxylic acid at 25° C. or $pKa_2$ of the aliphatic dicarboxylic acid at 25° C., whichever is greater, when (6) and (7) coexist, and
the pH of the aqueous solution (B) is 8 or less.

* * * * *